(12) United States Patent
Matsumoto et al.

(10) Patent No.: US 9,312,385 B2
(45) Date of Patent: Apr. 12, 2016

(54) SEMICONDUCTOR DEVICE AND MANUFACTURING METHOD OF SEMICONDUCTOR DEVICE

(75) Inventors: Daisuke Matsumoto, Tokyo (JP); Naoki Tega, Tokyo (JP); Yasuhiro Shimamoto, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 80 days.

(21) Appl. No.: 14/239,249

(22) PCT Filed: Jun. 7, 2012

(86) PCT No.: PCT/JP2012/064646
§ 371 (c)(1),
(2), (4) Date: May 2, 2014

(87) PCT Pub. No.: WO2013/027463
PCT Pub. Date: Feb. 28, 2013

(65) Prior Publication Data
US 2014/0239392 A1 Aug. 28, 2014

(30) Foreign Application Priority Data
Aug. 19, 2011 (JP) ................................. 2011-179550

(51) Int. Cl.
*H01L 27/12* (2006.01)
*H01L 21/336* (2006.01)
(Continued)

(52) U.S. Cl.
CPC ........ *H01L 29/7838* (2013.01); *H01L 29/0696* (2013.01); *H01L 29/1095* (2013.01);
(Continued)

(58) Field of Classification Search
CPC ..................... H01L 29/7838; H01L 29/7801
USPC ........................ 257/348, 329; 438/268, 273
See application file for complete search history.

(56) References Cited

U.S. PATENT DOCUMENTS

| 4,626,880 A | 12/1986 | Nguyen et al. |
| 4,651,181 A | 3/1987 | David |

(Continued)

FOREIGN PATENT DOCUMENTS

| EP | 0 536 668 A1 | 4/1993 |
| EP | 1 058 303 A1 | 12/2000 |

(Continued)

OTHER PUBLICATIONS

Partial Supplementary European Search Report issued Jun. 1, 2015, in European Patent Application No. 12825358.

(Continued)

*Primary Examiner* — Calvin Lee
(74) *Attorney, Agent, or Firm* — Miles & Stockbridge P.C.

(57) ABSTRACT

A technique for improving characteristics of a semiconductor device (DMOSFET) is provided. A semiconductor device is configured so as to include: an n-type source layer (102) disposed on an upper portion of a first surface side of an SiC substrate (106); a p body layer (103) which surrounds the source layer and has a channel region; an n⁻-type drift layer (107) which is in contact with the p body layer (103); a gate electrode (116) which is disposed on an upper portion of the channel region via a gate insulating film; and a first p⁺ layer (109) which is disposed in the p body layer (103), extends to a portion below the n⁺ source layer (102), and serves as a buried semiconductor region having an impurity concentration higher than that of the p body layer (103). In this manner, since the first p⁺ layer (109) is formed in the middle of the p body layer (103), it is possible to reduce the diffusion resistance of the p body layer (103). Thus, it is possible to make a parasitic bipolar transistor harder to turn on.

14 Claims, 30 Drawing Sheets

(51) Int. Cl.
*H01L 29/78* (2006.01)
*H01L 29/66* (2006.01)
*H01L 29/06* (2006.01)
*H01L 29/10* (2006.01)
*H01L 27/088* (2006.01)
*H01L 29/16* (2006.01)

(52) U.S. Cl.
CPC .... *H01L29/66674* (2013.01); *H01L 29/66712* (2013.01); *H01L 29/7801* (2013.01); *H01L 29/7802* (2013.01); *H01L 27/0883* (2013.01); *H01L 29/1608* (2013.01)

(56) References Cited

U.S. PATENT DOCUMENTS

| | | | |
|---|---|---|---|
| 4,680,604 A * | 7/1987 | Nakagawa | H01L 29/1095 257/142 |
| 5,621,234 A | 4/1997 | Kato | |
| 5,869,864 A | 2/1999 | Tihanyi | |
| 6,091,108 A | 7/2000 | Harris et al. | |
| 6,977,414 B2 | 12/2005 | Nakamura et al. | |
| 7,242,059 B2 | 7/2007 | Negoro et al. | |
| 2003/0006483 A1 * | 1/2003 | Spring | H01L 29/1095 257/563 |
| 2003/0201456 A1 | 10/2003 | Saitoh et al. | |
| 2009/0236636 A1 | 9/2009 | Hsu | |
| 2012/0223339 A1 | 9/2012 | Mizukami | |

FOREIGN PATENT DOCUMENTS

| | | |
|---|---|---|
| JP | 63-177473 | 7/1988 |
| JP | 05-102487 A | 4/1993 |
| JP | 2001-523895 (A) | 11/2001 |
| JP | 2004-022693 A | 1/2004 |
| JP | 2004-207492 A | 7/2004 |
| JP | 2004-241613 (A) | 8/2004 |
| JP | 2009-146946 A | 7/2009 |
| WO | WO 2011/033550 A1 | 3/2011 |

OTHER PUBLICATIONS

Office Action issued Aug. 12, 2014, in Japanese Patent Application No. 2011-179550.
Extended European Search Report for EP Application No. 12 82 5358.0 (mailed Oct. 28, 2015).
Office Action for related Japanese Patent Application No. 2011-179550 (mailed Feb. 9, 2016).

* cited by examiner

SEMICONDUCTOR DEVICE AND MANUFACTURING METHOD OF SEMICONDUCTOR DEVICE

TECHNICAL FIELD

The present invention relates to a semiconductor device and a manufacturing method of a semiconductor device, and more particularly relates to a technique effectively applied to a semiconductor device having a double-diffused MOSFET (DMOSFET).

BACKGROUND ART

A double-diffused MOSFET (Metal-Oxide-Semiconductor Field Effect Transistor) has a structure in which a low concentration P-type layer (P body) and a high concentration N-type layer ($N^+$ source layer) are formed by double diffusion on a front surface side of an N epitaxial layer formed on an $N^+$ substrate.

For example, the Patent Document 1 listed below discloses a power device having a structure in which respective cells are partly connected to one another in a p extraction region (4), so that a p base layer (3) constituting each unit cell of an n channel DMOS element is short-circuited with a source electrode (9) at a region (Z2) through the p extraction region (4). In this Document, by using the above-mentioned structure, an operation of parasitic transistor is suppressed, and the withstand capability of the elements is improved. Note that reference numerals in parentheses correspond to those described in Patent Document 1.

PRIOR ART DOCUMENTS

Patent Documents

Japanese Patent Application Laid-Open Publication No.

SUMMARY OF THE INVENTION

Problems to be Solved by the Invention

The inventors of the present invention have been engaged in researches and developments of power devices, and have studied about the improvement of characteristics of the above-mentioned DMOSFET and the like.

As will be described later in detail, in the DMOSFET, there is fear that device characteristics might be deteriorated due to the operation of a parasitic npn bipolar transistor. In order to suppress the operation of the parasitic npn bipolar transistor like this, the adoption of the structure shown in the above-mentioned Patent Document 1 is considered. In this case, however, since it is necessary to form contacts from both of a region surrounded by the $n^+$ source layer (5) in the cell center and the p extraction region (4), the cell area is expanded. As a result, since the ratio of the area occupied by the channel region per unit area of the element becomes relatively small, the current density of the DMOSFET is lowered.

Therefore, an object of the present invention is to provide a technique capable of improving the characteristics of the semiconductor device, in particular, to provide a structure of the semiconductor device (DMOSFET) capable of suppressing the operation of the parasitic bipolar transistor. Another object is to provide a semiconductor device (DMOSFET) capable of designing a cell region to be small, thereby improving a current density.

Moreover, still another object of the present invention is to provide a manufacturing method of a semiconductor device having superior characteristics.

The above and other objects and novel characteristics of the present invention will be apparent from the description of the present specification and the accompanying drawings.

Means for Solving the Problems

The following is a brief description of an outline of the typical invention disclosed in the present application.

In the invention disclosed in this application, a semiconductor device shown in a typical embodiment includes: a first source region of a first conductivity type which is disposed on an upper portion of a first surface side of a substrate; a first semiconductor region of a second conductivity type which surrounds the first source region and has a channel region; a second semiconductor region of the first conductivity type which is in contact with the first semiconductor region; a gate electrode which is disposed on an upper portion of the channel region via a gate insulating film; and a buried semiconductor region of the second conductivity type which is disposed in the first semiconductor region, extends to a portion below the source region, and has a concentration of an impurity of the second conductivity type higher than that in the first semiconductor region.

In the invention disclosed in this application, a semiconductor device shown in a typical embodiment includes: a first semiconductor region of a second conductivity type which is disposed on an upper portion of a first surface side of a substrate; a plurality of source regions of a first conductivity type which are disposed on the upper portion of the first surface side of the substrate and arranged on a circumference of the first semiconductor region so as to be spaced apart from one another; second semiconductor regions of the second conductivity type which respectively surround the plurality of source regions; a gate electrode which is disposed on an upper portion of the second semiconductor region via a gate insulating film; and a buried semiconductor region of the second conductivity type which is disposed in the first semiconductor region, extends from a lower portion of the first semiconductor region to a portion below the plurality of source regions, and has a concentration of an impurity of the second conductivity type higher than that in the second semiconductor region.

In the invention disclosed in this application, a manufacturing method of a semiconductor device shown in a typical embodiment includes the steps of: (a) preparing a substrate having a first semiconductor region of a first conductivity type on a first surface side; (b) forming a second semiconductor region of a second conductivity type in the first semiconductor region; (c) forming a buried semiconductor region of the second conductivity type in the second semiconductor region; and (d) forming a source region of the first conductivity type above the buried semiconductor region so as to be located in the second semiconductor region.

Effects of the Invention

According to a semiconductor device described in the following typical embodiments of the inventions disclosed in this application, it is possible to improve the characteristics of the semiconductor device.

Furthermore, according to a manufacturing method of a semiconductor device described in the following typical embodiments of the inventions disclosed in this application, it is possible to manufacture a semiconductor device having superior characteristics.

BRIEF DESCRIPTIONS OF THE DRAWINGS

BEST MODE FOR CARRYING OUT THE INVENTION

Hereinafter, embodiments of the present invention will be described in detail with reference to the accompanying drawings.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical values (for example, number of pieces, values, amount and the range) described above.

Hereinafter, embodiments of the present invention will be described in detail with reference to the accompanying drawings. Note that components having the same function are denoted by the same reference symbols throughout the drawings for describing the embodiments, and the repetitive description thereof will be omitted. In addition, the description of the same or similar portions is not repeated in principle unless particularly required in the following embodiments.

Also, in some drawings used in the following embodiments, hatching is omitted even in a sectional view and hatching is used even in a plan view so as to make the drawings easy to see.

First Embodiment

Description of Structure

Figure 1:
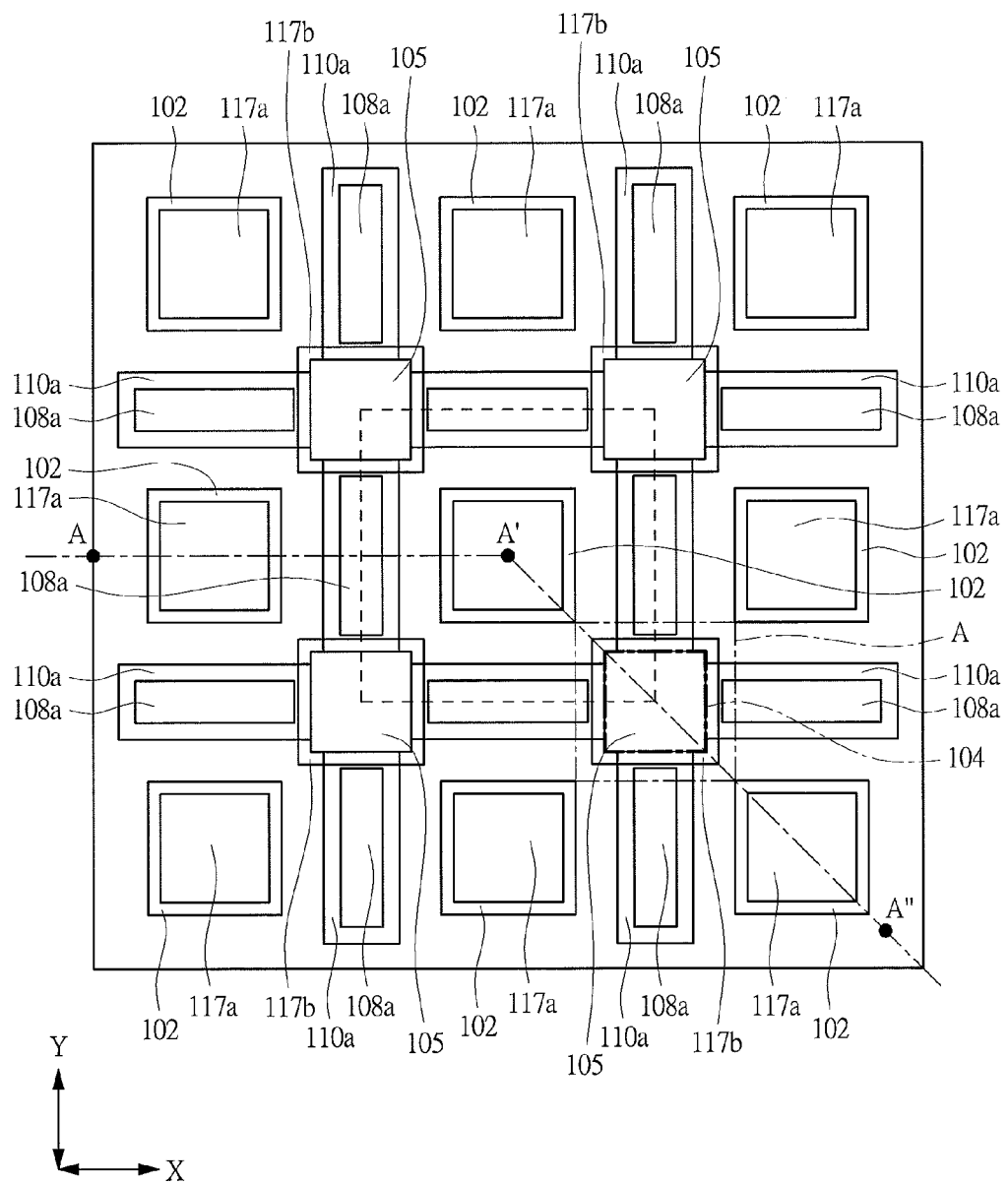
FIG. 1 is a plan view of a principal part of a semiconductor device of the first embodiment.
Figure 2:
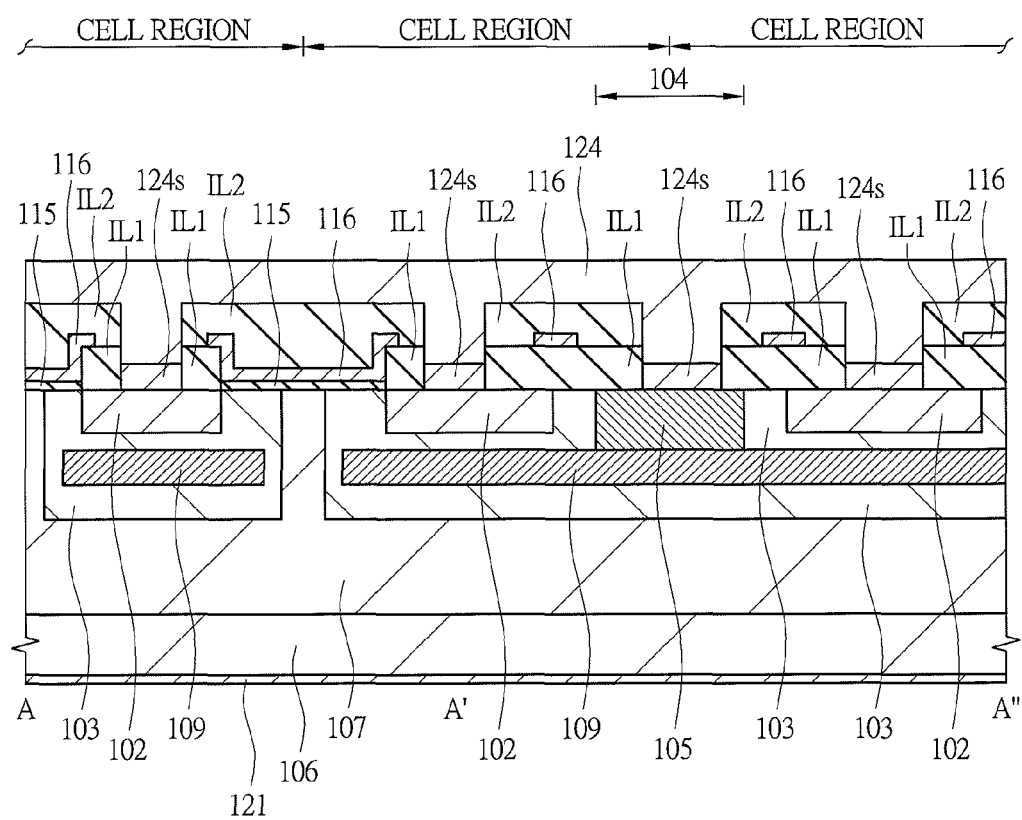
FIG. 2 is a sectional view of a principal part of the semiconductor device of the first embodiment.

A structure of a semiconductor device (DMOSFET) of the present embodiment will be described with reference to FIG. 1 and FIG. 2. FIG. 1 is a plan view of a principal part of the semiconductor device of the present embodiment, and FIG. 2 is a sectional view of a principal part of the semiconductor device of the present embodiment. FIG. 2 corresponds to, for example, a cross section taken along a line A-A" of FIG. 1.

As shown in FIG. 1, in the present embodiment, cell regions, each corresponding to a rectangular region surrounded by a broken line in FIG. 1 are repeatedly disposed line-symmetrically in an X-direction (lateral direction in the drawing, that is, right and left direction) and a Y-direction (longitudinal direction in the drawing, that is, up and down direction). By disposing the plurality of cell regions in the X-direction and Y-direction, one semiconductor device (DMOSFET) is configured. Note that the plurality of cell regions constituting the semiconductor device (DMOSFET) are sometimes referred to as a cell array region (array region or array). Also, although only nine cell regions with 3 lines and 3 rows (3×3) are shown in FIG. 1, the semiconductor device (DMOSFET) may be constituted by using 9 or more cell regions and the semiconductor device (DMOSFET) may be constituted by using less than 9 cell regions.

In the center portion of one cell region, an $n^+$ source layer (source region) 102 is located. In other words, a virtually rectangular-shaped region defined by lines extending in the X-direction and Y-direction in the center portions between the $n^+$ source layers (source regions) 102 corresponds to the cell region. In FIG. 1, the $n^+$ source layer (source region) 102 has a square shape (regular tetragon), and the cell region is also shown as a square shape (regular tetragon).

In the one cell region, a p body layer (p-type body region, p-type semiconductor region, second conductivity type semiconductor region) 103 is disposed on the outer circumference of the $n^+$ source layer (source region, n-type semiconductor region, first conductivity type semiconductor region) 102 (FIG. 2). As is apparent from FIG. 2, the p body layer 103 extends to a position deeper the $n^+$ source layer (source region) 102. Therefore, the p body layer 103 is disposed so as to surround the $n^+$ source layer (source region) 102.

Moreover, on the p body layer 103, a gate electrode 116 is disposed via a gate insulating film 115 (FIG. 2). During the operation of the DMOSFET, a channel (channel region, inversion layer) is formed on the surface of the p body layer 103, and a current flows into a drain electrode 121 from the $n^+$ source layer (source region) 102 via the channel, an $n^-$ drift layer 107 and an SiC substrate 106 described later. Therefore, the gate electrode 116 needs to be disposed at least on an upper portion of an exposed region of the p body layer 103 on the front surface (first surface) side of the substrate. In this case, as shown in FIG. 2, the gate electrode 116 is disposed so as to extend from the position on the exposed region of the p body layer 103 to an exposed region (108a) of the $n^-$ drift layer 107 described later. Moreover, the gate electrode 116 can be formed so as to extend to a region other than a connection region between the $n^+$ source layer 102 and a source electrode (124) and between a second $p^+$ layer (lead-out portion, contact portion) 105 and the source electrode (see FIG. 16). In this manner, this gate electrode 116 is electrically connected between the cell regions.

Moreover, in the cell array region (plural cell regions), the p body layer 103 is disposed in a region other than the exposed region 108a. The exposed region 108a corresponds to the exposed region of the $n^-$ drift layer 107, and the exposed region 108a is disposed between the $n^+$ source layers (source regions) 102. For example, in the region where the four $n^+$ source layers (source regions) 102 are disposed with 2 lines and 2 rows (2×2), the exposed region 108a is disposed in the X-direction and Y-direction between the $n^+$ source layers 102, but no exposed region 108a is disposed between the $n^+$ source layers 102 located at diagonal positions (FIG. 1). Therefore, the p body layer 103 is electrically connected between the cell regions (see FIG. 5).

Between the $n^+$ source layers 102 located at diagonal positions (in other words, in the 2×2 region, between the $n^+$ source layer 102 on the upper right side and the $n^+$ source layer 102 on the lower left side or between the $n^+$ source layer 102 on the lower right side and the $n^+$ source layer 102 on the upper left side), an electric field relaxation region 104 (region surrounded by a thick one-dot chain line in FIG. 1, cell connection region) is defined. This electric field relaxation region 104 is positioned in a region A formed by connecting adjacent vertices (corner portions) of the four $n^+$ source layers (source regions) 102. In other words, the electric field relaxation region 104 is a region that is positioned inside the region A and is smaller than the region A.

In the present embodiment, in the inside (middle) of the p body layer 103, a first $p^+$ layer 109 (buried layer, buried semiconductor region, p-type buried semiconductor region, second conductivity type buried semiconductor region) is disposed (FIG. 2). The upper portion of the first $p^+$ layer 109 is deeper than the bottom portion of the $n^+$ source layer 102, and the p body layer 103 is interposed between the upper portion of the first $p^+$ layer 109 and the bottom portion of the $n^+$ source layer 102 (FIG. 2). Moreover, as shown in FIG. 2, the first $p^+$ layer 109 is electrically connected to the second $p^+$ layer (lead-out portion, contact portion, p-type semiconductor region, second conductivity type semiconductor region) 105 in the above-mentioned electric field relaxation region 104 (see FIG. 2 and FIG. 1).

The formation region of the first $p^+$ layer 109 is disposed in a region other than an opening portion 110a. This opening portion 110a is a region slightly larger than the above-mentioned exposed region 108a. Therefore, the first $p^+$ layer 109 is also electrically connected between the cell regions via the above-mentioned region A (see FIG. 7).

When the structure of the first and second $p^+$ layers (109, 105) are described in a different manner, the first $p^+$ layer 109 is disposed so as to extend from the lower portion of the second $p^+$ layer (lead-out portion, contact portion) 105 positioned in the above-mentioned electric field relaxation region 104 to the lower portion of (below) the $n^+$ source layer (source region) 102.

The impurity concentration of the first and second $p^+$ layers (109, 105) is higher than the impurity concentration of the p body layer 103.

Moreover, in the exposed region 108a, the $n^-$ drift layer 107 (n-type semiconductor region, first conductivity type semiconductor region) is exposed on the front surface (first surface) side of the SiC substrate 106, and the n drift layer 107 extends also to the lower portion of the p body layer 103. In other words, the $n^-$ drift layer 107 is disposed so as to surround the p body layer 103.

The $n^+$-type SiC substrate 106 is disposed below the $n^-$ drift layer 107, and the $n^+$-type SiC substrate 106 serves as a drain layer (drain region, n-type semiconductor region, first conductivity type semiconductor region). Moreover, on the rear surface (second surface) of the SiC substrate 106, a rear surface electrode (drain electrode) 121 is disposed.

Moreover, on the upper portions of the n+ source layer 102 and the second p+ layer 105, an interlayer insulating film IL1 is disposed, and on the upper portion of the gate electrode 116, an interlayer insulating film IL2 is disposed.

In these interlayer insulating films (IL1 and IL2), contact holes for exposing the above-mentioned n+ source layer 102 and second p+ layer 105 are formed. In the inside of the contact holes and on the upper portion of the interlayer insulating film IL2, a source electrode (source wire, wiring) 124 is disposed. Moreover, at an interface between the source electrode 124 and the n+ source layer 102 and at an interface between the source electrode 124 and the second p+ layer 105, a metal silicide 124s is disposed.

As described above, in the semiconductor device (DMOSFET) of the present embodiment, since the first p+ layer 109 is formed in the middle of the p body layer 103, it is possible to reduce the diffusion resistance of the p body layer 103 and also to suppress the operation of a parasitic bipolar transistor formed in a parasitic npn region. As a result, it becomes possible to reduce a surge current and consequently to prevent characteristic degradation and damage of the DMOSFET due to the surge current.

Moreover, in the present embodiment, since the second p+ layer 105 which serves as a lead-out portion for leading out the first p+ layer 109 is disposed by utilizing the electric field relaxation region 104, the n+ source layer 102 can be made smaller. Furthermore, the number of cells per unit area can be increased and the occupied ratio of the channel region can be increased. Thus, for example, an on-resistance can be reduced. Moreover, the amount of current per unit area can be improved. In this manner, the characteristics of the DMOSFET can be improved.

Also, in comparison with a case in which the lead-out portion is formed in the n+ source layer, it becomes possible to increase the connection area between the n+ source layer 102 and the source electrode (124, 124a) and consequently to reduce the source resistance.

The effects mentioned above will be described in more detail in the following section of "Description of Manufacturing Method" while comparing with comparative examples.

[Description of Manufacturing Method]

Next, a manufacturing method of the semiconductor device of the present embodiment will be described with reference to FIG. 3 to FIG. 19, and a structure of the semiconductor device is more clarified. FIG. 3 to FIG. 19 are sectional views and plan views of a principal part showing the manufacturing process of the semiconductor device of the present embodiment.

Figure 3:
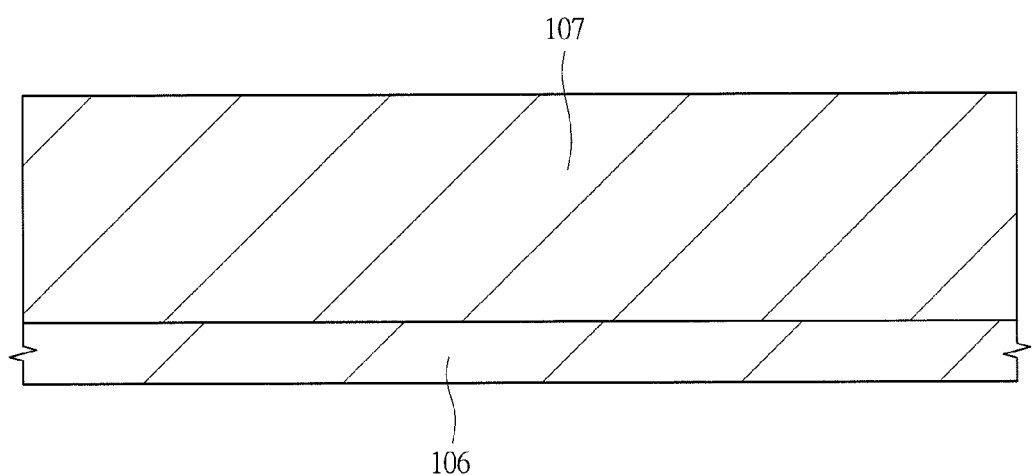
FIG. 3 is a sectional view of a principal part showing a manufacturing process of the semiconductor device of the first embodiment.

As shown in FIG. 3, for example, an SiC substrate 106 is prepared as a substrate. This SiC substrate 106 is, for example, an n+-type 4H—SiC substrate (SiC substrate of hexagonal system). The impurity concentration of the substrate is, for example, in a range from $1\times10^{18}$ to $1\times10^{21}$ cm$^{-2}$. As the n-type impurity, for example, nitrogen (N) is contained therein. Moreover, the 4H—SiC substrate 106 has a thin Si (silicon) surface on its one surface and a thin C (carbon) surface on the other surface. However, any of these surfaces may be used as the front surface. In other words, a semiconductor device described later may be formed on any of the surfaces.

As the substrate 106, an Si substrate may be used. However, SiC (silicon carbide) has insulation breakdown electric field 1.5 to 3 times as high as that of Si (silicon), and is desirably used for a power device such as a DMOSFET. In particular, since the 4H—SiC (SiC of hexagonal system) exerts a high insulation breakdown electric field and a high degree of mobility, the characteristics of the semiconductor device (DMOSFET) can be improved by using the semiconductor like this as the substrate (106) and the semiconductor region (107).

By growing a semiconductor region made of SiC on the front surface of the SiC substrate 106 by using an epitaxial growth method, an n− drift layer 107 is formed thereon. For example, by using material gas containing SiH$_4$ as an Si source and C$_3$H$_8$ as a C source, the 4H—SiC is epitaxially grown on the substrate 106 so as to have a film thickness of about 2 μm to 50 μm. At this time, by using the material gas containing nitrogen (N$_2$), an n-type impurity is introduced into the 4H—SiC. This n− drift layer 107 and the p body layer 103 described later form a pn-junction. Therefore, the impurity concentrations of these semiconductor regions (103, 107) are factors for determining the width of a depletion layer of the pn-junction. The impurity concentration of the n drift layer 107 is, for example, in a range from $1\times10^{15}$ to $1\times10^{17}$ cm$^{-3}$. Note that a laminated body of the above-mentioned SiC substrate 106 and n− drift layer 107 may be regarded as a substrate.

Figure 4:
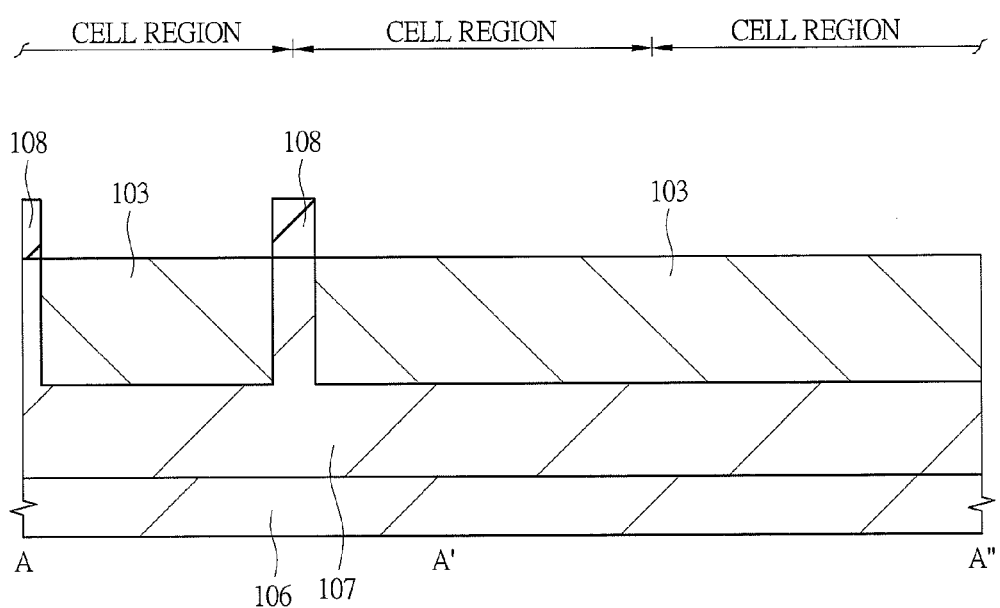
FIG. 4 is a sectional view of a principal part showing the manufacturing process of the semiconductor device of the first embodiment continued from FIG. 3.

Next, as shown in FIG. 4, the p body layer 103 is partially formed on the surface of the n− drift layer 107. More specifically, after a photoresist film 108 is applied onto the n− drift layer 107 and the pattern is transferred by exposure, the developing process (photolithography) is performed. It is also possible to perform the developing process after drawing a pattern by using an electron beam or the like. In this manner, a region where no p body layer 103 is formed is covered with the photoresist film 108. By implanting a p-type impurity with this photoresist film 108 after the development used as a mask, the p body layer 103 is formed. For example, the depth of the impurity implantation is shallower than the bottom portion of the n drift layer 107, and is, for example, about 1 μm. Also, the impurity concentration is, for example, in a range from $1\times10^{16}$ to $1\times10^{19}$ cm$^{-3}$. Moreover, for example, Al (aluminum) is used as the p-type impurity.

Figure 5:
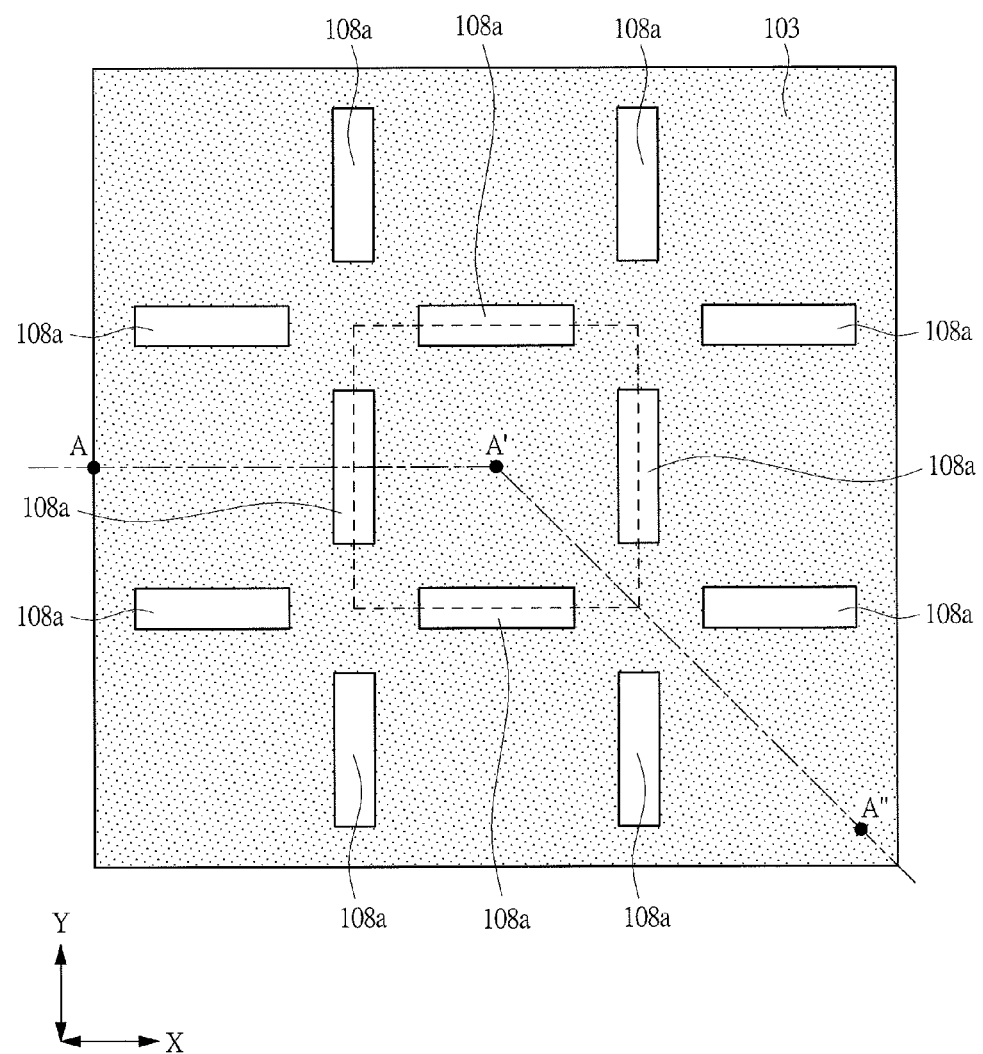
FIG. 5 is a plan view of a principal part showing the manufacturing process of the semiconductor device of the first embodiment.

Thereafter, by removing the photoresist film 108 by asking or the like, the p body layer 103 on which the n− drift layer 107 is partially exposed is formed as shown in FIG. 5. The exposed region of the n− drift layer 107 is denoted by 108a in the plan view. In FIG. 5, the formation region of the p body layer 103 is hatched with dots.

Figure 6:
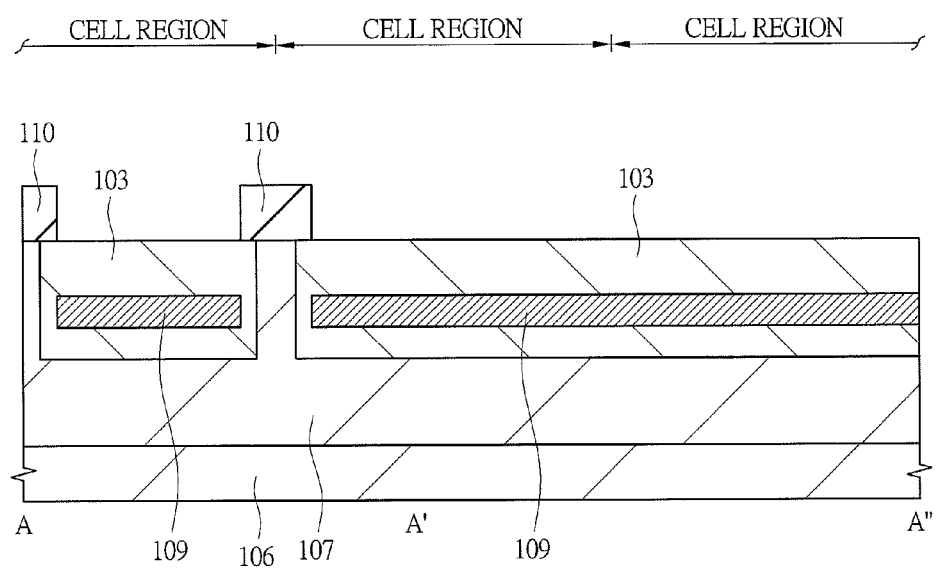
FIG. 6 is a sectional view of a principal part showing the manufacturing process of the semiconductor device of the first embodiment continued from FIG. 4.

Next, as shown in FIG. 6, in the middle of the p body layer 103, a first p+ layer 109 is formed. More specifically, after a photoresist film 110 is applied onto the p body layer 103 including the exposed region 108a and the pattern is transferred by exposure, a developing process is performed. In this manner, the photoresist film 110 is left on a region that is slightly larger than the above-mentioned exposed region 108a. By implanting a p-type impurity with this photoresist film 110 after the development used as a mask, the first p+ layer 109 is formed. For example, the depth of the impurity implantation is shallower than the bottom portion of the p body layer 103, and is deeper than the upper portion of the p body layer 103. In this manner, the first p+ layer 109 is formed so as to be positioned in the middle of the p body layer 103. The depth of the impurity is, for example, in a range from 0.5 μm to 1 μm, and the implantation energy of the impurity is adjusted so that the bottom portion of the first p+ layer 109 is located at a position that is shallower than the bottom portion of the p body layer 103 and deeper than the bottom portion of the n+ source layer 102 described later. The impurity concentration of the first p+ layer 109 is higher than the impurity concentration (range from $1\times10^{16}$ to $1\times10^{18}$ cm$^{-3}$) of the above-mentioned p body layer 103 and is set to be in a range from, for example, about $1\times10^{18}$ to $1\times10^{21}$ cm$^{-3}$. Moreover, the thickness of the impurity layer is, for example, about 0.1 μm to 0.5 μm. Also, as the p-type impurity, for example, Al is used.

Figure 7:
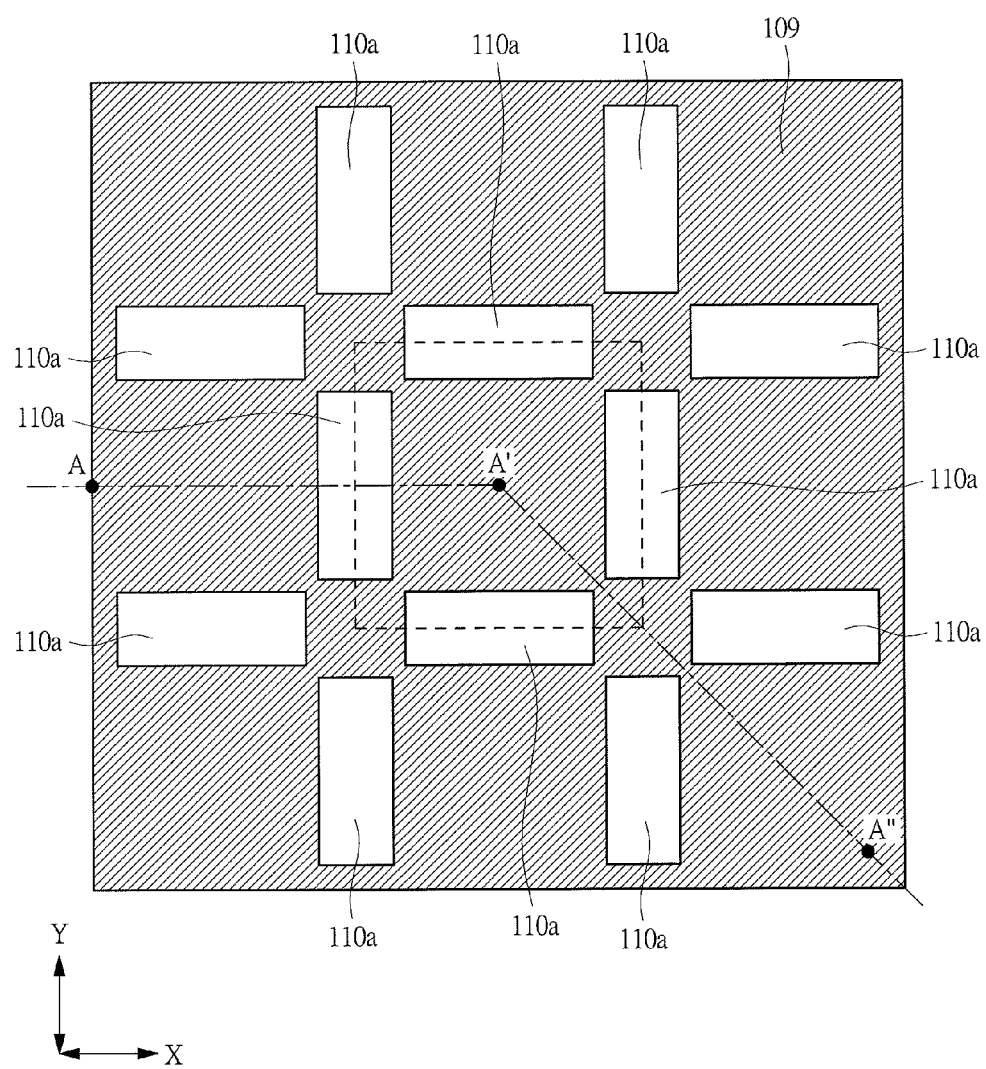
FIG. 7 is a plan view of a principal part showing the manufacturing process of the semiconductor device of the first embodiment.

Thereafter, by removing the photoresist film 110 by asking or the like, the first p+ layer 109 having openings for the exposed regions 108a of the n− drift layer 107 and the outer circumferential portions thereof is formed at a position deeper than the surface of the p body layer 103. In other words, the first p+ layer 109 having the opening portions 110a is formed. In FIG. 7, the formation region of the first p+ layer 109 is hatched with dots.

Figure 8:
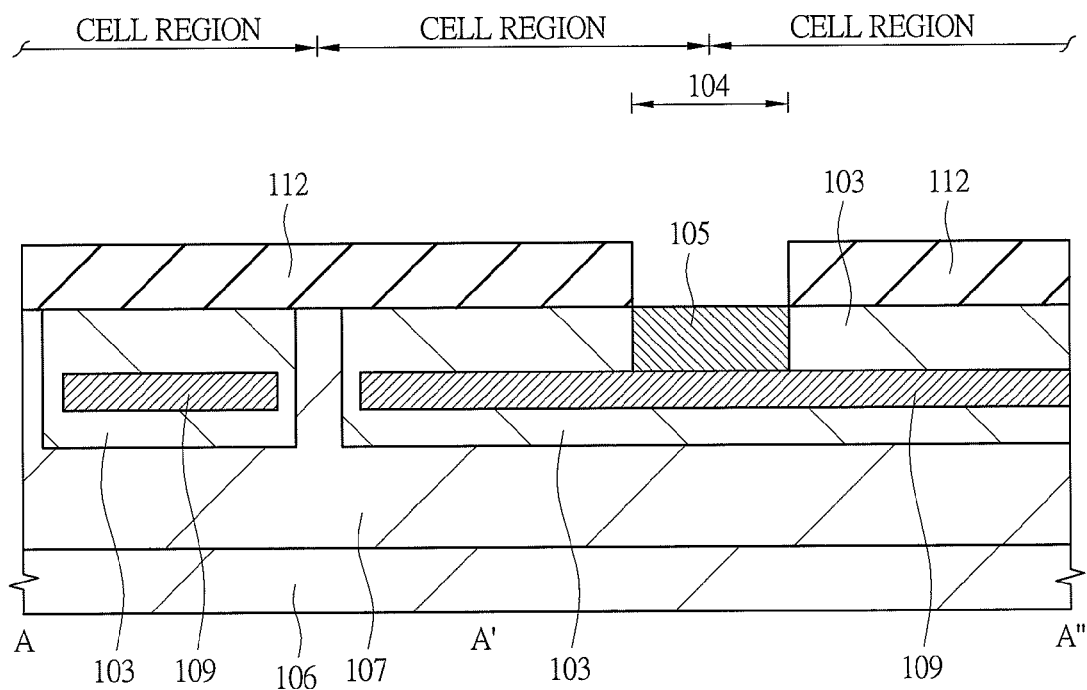
FIG. 8 is a sectional view of a principal part showing the manufacturing process of the semiconductor device of the first embodiment continued from FIG. 6.

Next, as shown in FIG. 8, the second p+ layer 105 is formed on the first p+ layer 109, that is, in the electric field relaxation region (104, see FIG. 1) described in the section of "Description of Structure". More specifically, after a photoresist film 112 is applied onto the p body layer 103 including the exposed region 108a and the pattern is transferred by exposure, a developing process is performed. In this manner, an opening is formed in the photoresist film 112 in the electric field relaxation region 104. By implanting a p-type impurity with the photoresist film 112 after the development used as a mask, the second p+ layer 105 is formed. For example, the depth of the impurity implantation is set to the depth reaching the first p+ layer 109, and the impurity is implanted so as to reach the surface of the p body layer 103. In this manner, the second p+ layer 105 is formed on the first p+ layer 109 as to be electrically connectable to the first p+ layer 109. The impurity concentration thereof is set to be higher than the impurity concentration of the above-mentioned p body layer 103 (in a range from $1\times10^{16}$ to $1\times10^{19}$ cm$^{-3}$), for example, to about $1\times10^{18}$ to $1\times10^{21}$ cm$^{-3}$. Also, the thickness of the impurity layer is, for example, about 0.1 μm to 0.5 μm. Furthermore, as the p-type impurity, for example, Al is used.

Figure 9:
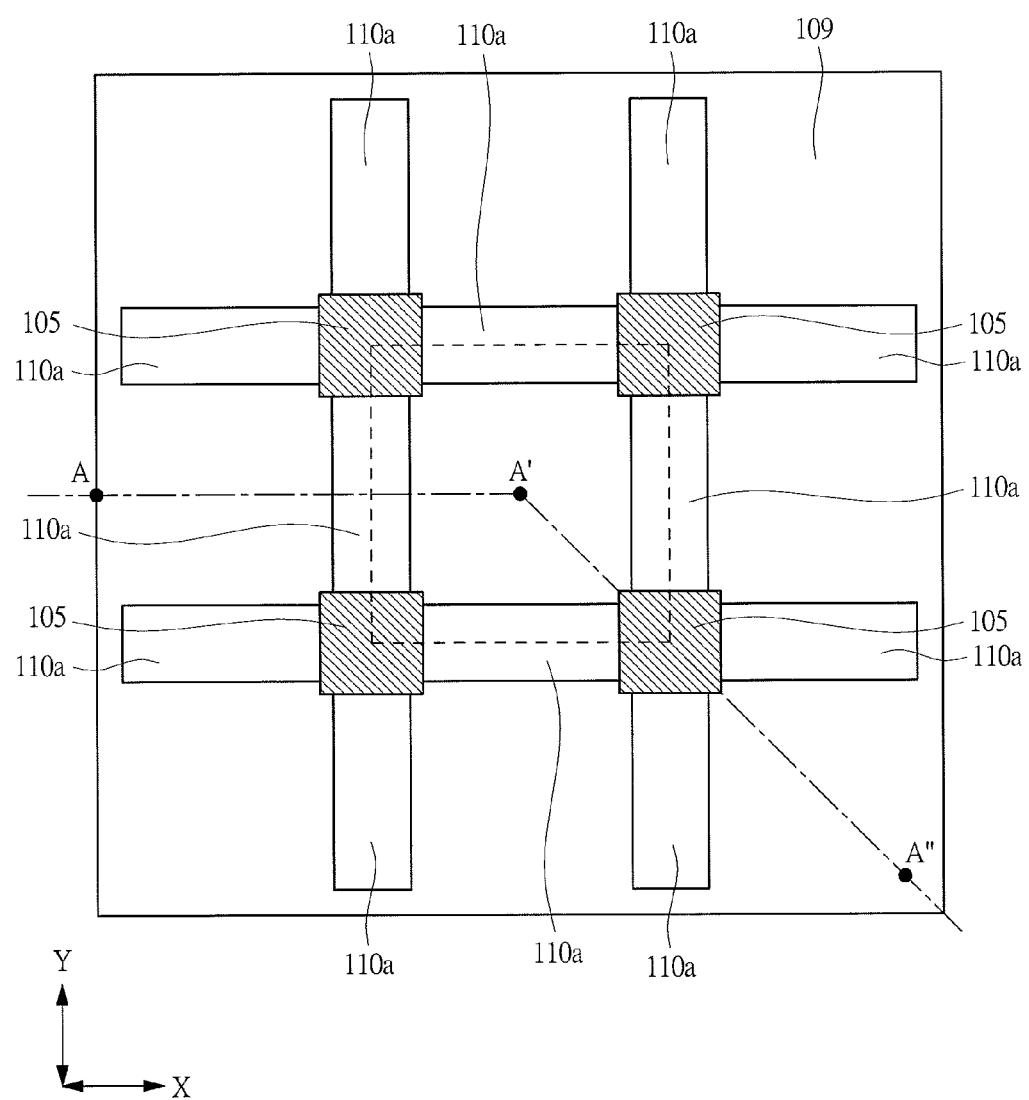
FIG. 9 is a plan view of a principal part showing the manufacturing process of the semiconductor device of the first embodiment.

Thereafter, by removing the photoresist film 112 by ashing or the like, the second p+ layer 105 is formed on the connection region. In FIG. 9, the formation region of the second p+ layer 105 is hatched with dots.

Figure 10:
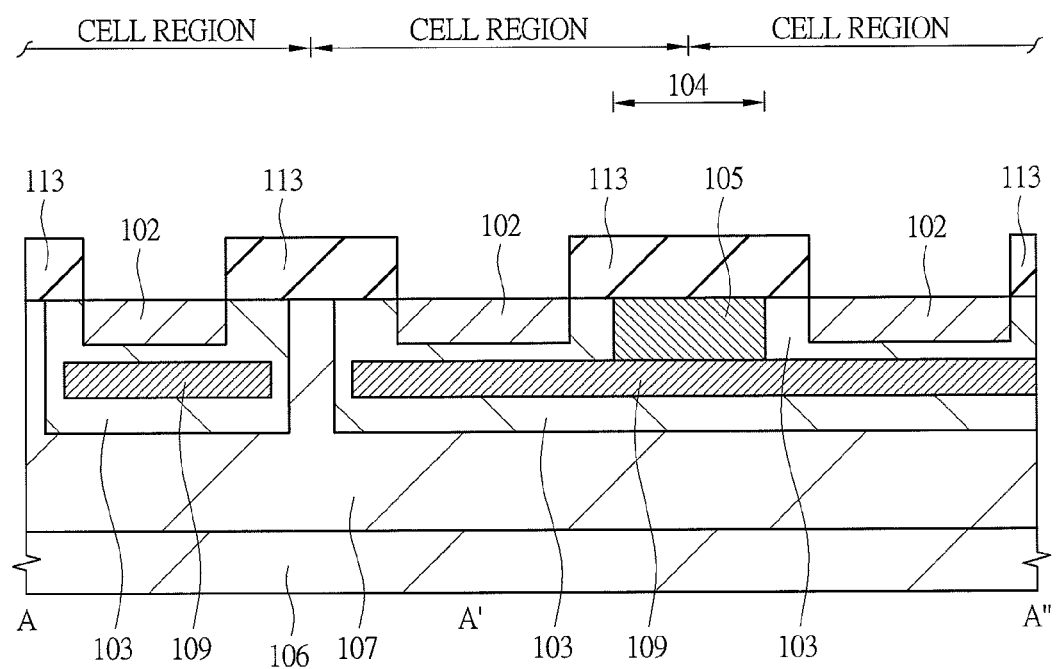
FIG. 10 is a sectional view of a principal part showing the manufacturing process of the semiconductor device of the first embodiment continued from FIG. 8.

Next, as shown in FIG. 10, the n+ source layer 102 is formed on the surface portion of the p body layer 103. More specifically, after a photoresist film 113 is applied onto the p body layer 103 including the upper portion of the second p+ layer 105 and the pattern is transferred by exposure, a developing process is performed. In this manner, the photoresist film 113 having an opening for a source formation region is left. By implanting an n-type impurity with the photoresist film 113 after the development used as a mask, the n+ source layer 102 is formed. For example, the depth of the impurity implantation is set to be shallower than the upper portion of the first p+ layer 109 and is, for example, about 0.5 μm. In this manner, the n+ source layer 102 is formed on the surface portion of the p body layer 103. For example, the impurity concentration is in a range from $1\times10^{18}$ to $1\times10^{21}$ cm$^{-3}$. Also, as the p-type impurity, for example, nitrogen (N) is used.

Figure 11:
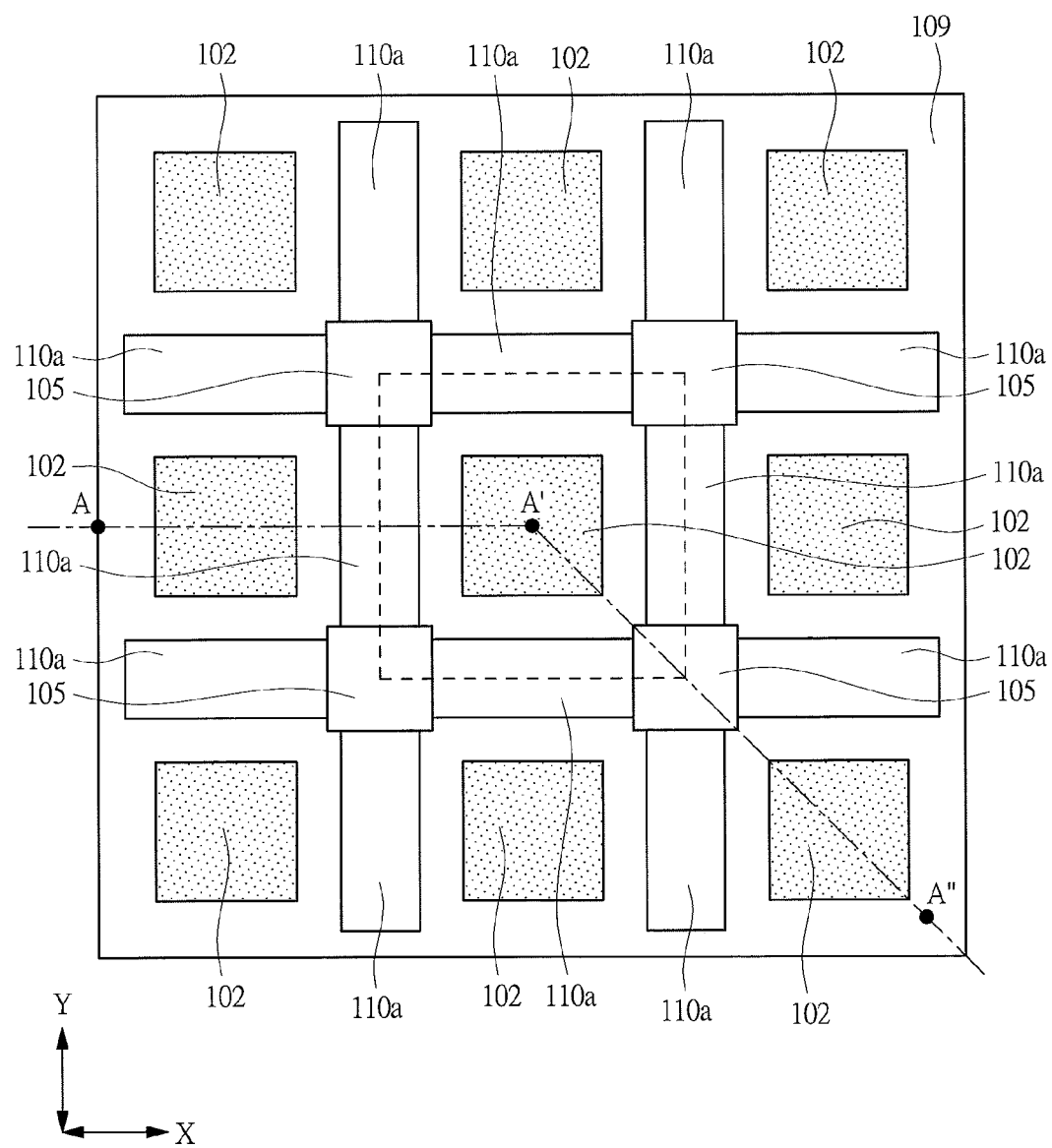
FIG. 11 is a plan view of a principal part showing the manufacturing process of the semiconductor device of the first embodiment.

Thereafter, by removing the photoresist film 113 by ashing or the like, the n+ source layer 102 is formed in the virtually center portion of the cell region. In FIG. 11, the formation region of n+ source layer 102 is hatched with dots.

Next, an annealing process (heat treatment) is performed at, for example, about 1700° C. so as to recover the crystallinity disturbed by the above-mentioned ion introduction (implantation) process and also activate the introduced impurity.

Note that the order of the various ion introduction (implantation) processes is not limited to the above-mentioned order of processes. For example, by adjusting implantation conditions (kinds of impurity ions, concentrations, implantation energy, and others), the respective semiconductor regions (impurity regions 102, 103, 105 and 109) can be formed at the positions shown in FIGS. 1 and 2. Therefore, for example, the first p+ layer 109 may be formed after the second p+ layer 105 is formed, and the respective semiconductor regions may be formed in any order.

Figure 12:
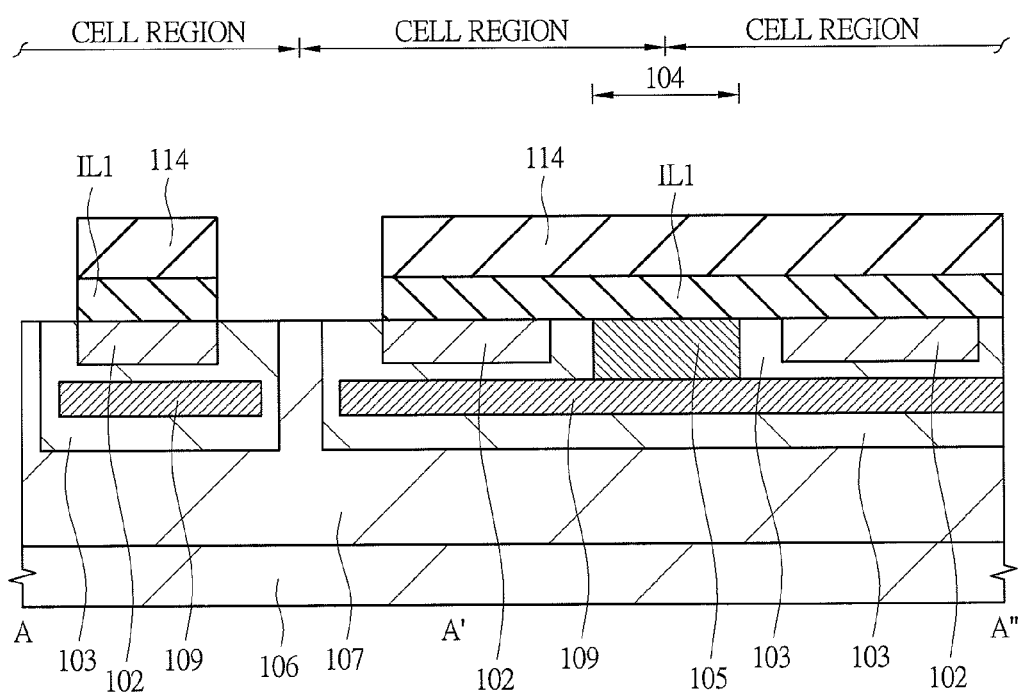
FIG. 12 is a sectional view of a principal part showing the manufacturing process of the semiconductor device of the first embodiment continued from FIG. 10.
Figure 16:
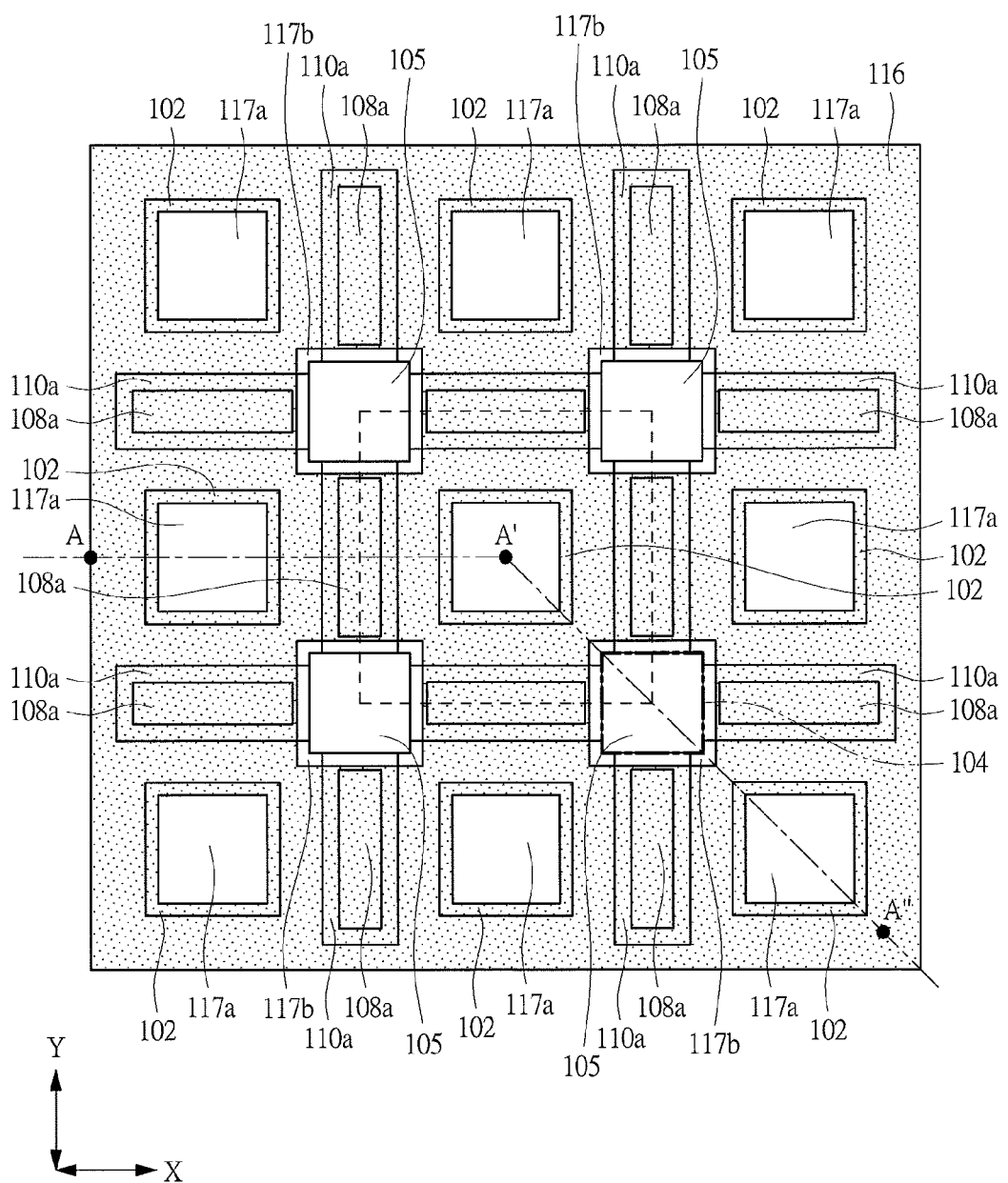
FIG. 16 is a plan view of a principal part showing the manufacturing process of the semiconductor device of the first embodiment.

Next, as shown in FIG. 12, an insulating film (field insulating film, interlayer insulating film) IL1 having an opening in the gate insulating film formation region is formed. More specifically, for example, a silicon oxide (SiO$_2$) film is formed as the insulating film IL1 on the surface portion of the p body layer 103 including the regions on the n+ source layer 102, the second p+ layer 105 and the like by using a CVD (Chemical Vapor Deposition) method or the like. Next, after a photoresist film 114 is applied onto the insulating film IL1 and the pattern is transferred by exposure, a developing process is performed (photolithography). In this manner, opening portions are formed in the gate insulating film formation region. By etching the insulating film IL1 with the photoresist film 114 after the development as a mask, the insulating film IL1 in the gate insulating film formation region is removed. In this case, the insulating film IL1 is etched so that the gate insulating film is formed at least on the above-mentioned exposed region 108a and the p body layer 103 adjacent thereto. Note that the above-mentioned photolithography and etching processes are sometimes referred to as patterning. As the above-mentioned etching process of the insulating film IL1, for example, a wet etching using a buffered hydrofluoric acid may be performed. Thereafter, by removing the photoresist film 114 by asking or the like, the insulating film IL1 having opening portions in the gate insulating film formation region is formed. As shown in FIG. 16 described later, the formation region of the gate electrode corresponds to a region other than the formation region of the contact holes on the n+ source layer 102 and the second p+ layer 105.

Figure 13:
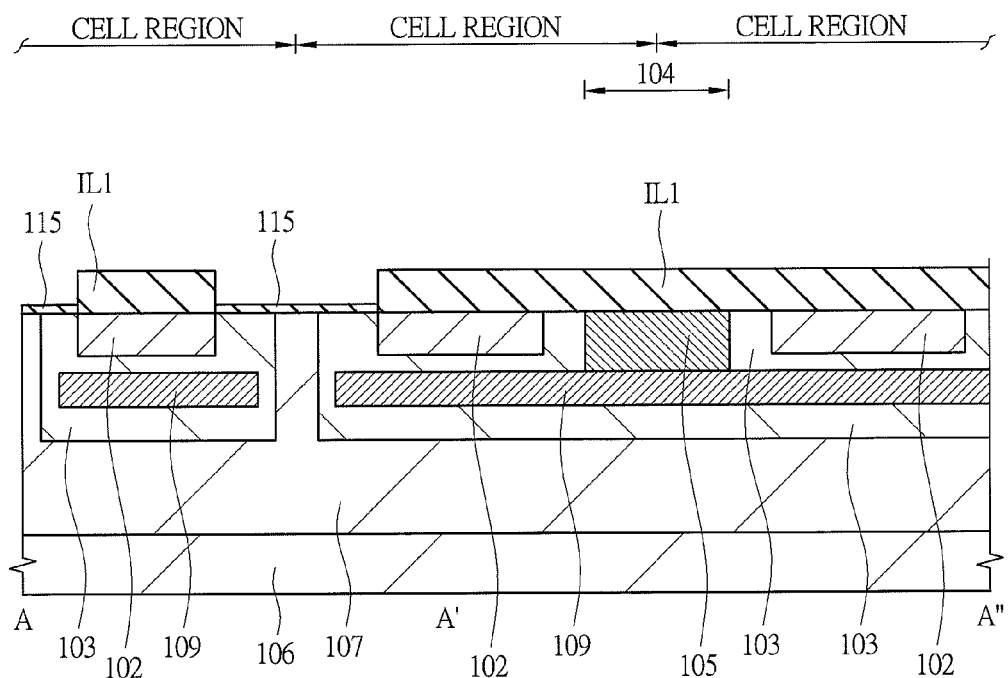
FIG. 13 is a sectional view of a principal part showing the manufacturing process of the semiconductor device of the first embodiment continued from FIG. 12.

Next, as shown in FIG. 13, agate insulating film 115 is formed in the opening portion of the insulating film IL1 by using, for example, a thermal oxidation method. For example, by exposing the SiC substrate 106 to an oxygen atmosphere at about 1050° C., the surface of the semiconductor region (107, 103) exposed from the opening portion is oxidized. In this manner, the gate insulating film 115 made of silicon oxide (oxidized Si) is formed in the opening portion. Note that the gate insulating film 115 may be formed by depositing an insulating film such as a silicon oxide film on the insulating film IL1 including the inside of the opening portion by using a CVD method or the like.

Figure 14:
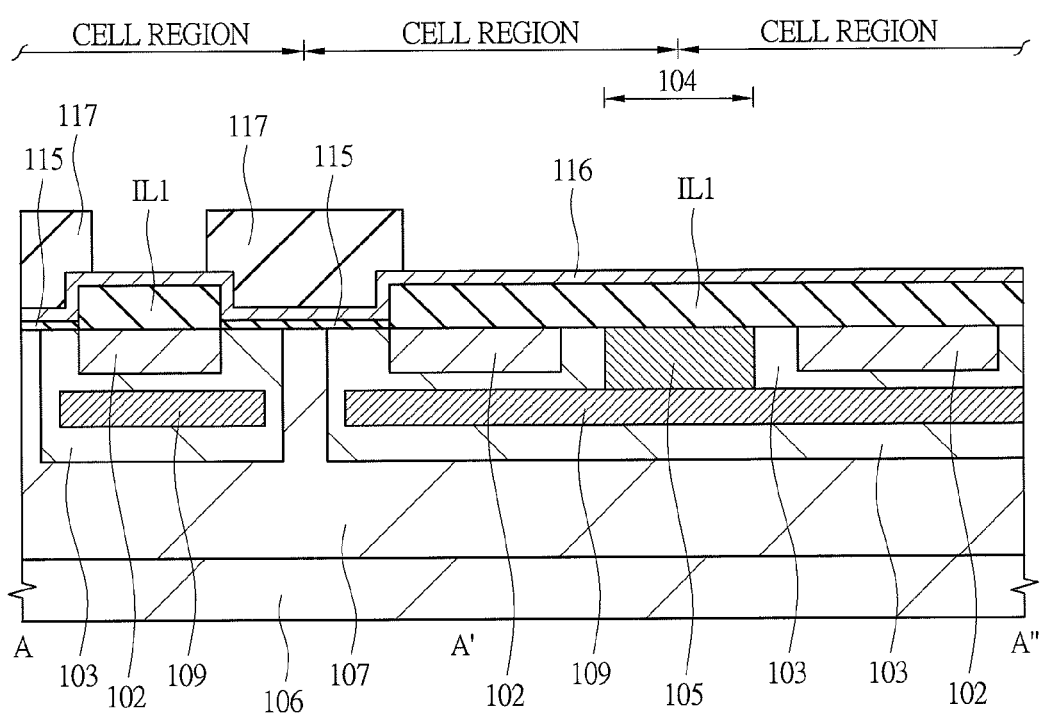
FIG. 14 is a sectional view of a principal part showing the manufacturing process of the semiconductor device of the first embodiment continued from FIG. 13.
Figure 15:
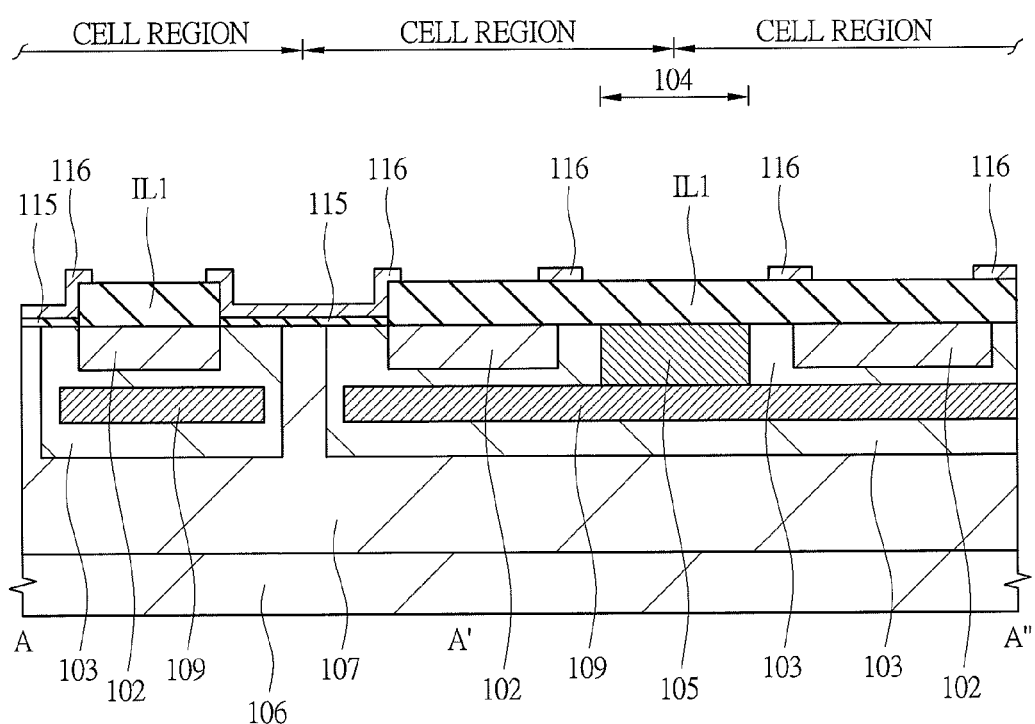
FIG. 15 is a sectional view of a principal part showing the manufacturing process of the semiconductor device of the first embodiment continued from FIG. 14.

Next, as shown in FIG. 14, the gate electrode 116 is formed on the gate insulating film 115 in the opening portion of the insulating film IL1. For example, on the insulating film IL1 including the inside of the opening portion, a silicon film is deposited as a conductive film by using the CVD method or the like. As this silicon film, for example, polycrystalline silicon doped with an impurity such as P (phosphorus) may be used. Next, after a photoresist film 117 is applied onto the silicon film (116) and the pattern is transferred by exposure, a developing process is performed. In this manner, the photoresist film 117 is left in the gate electrode formation region. By performing a dry etching process on the silicon film (116) with the photoresist film 117 after the development used as a mask, the gate electrode 116 is formed (FIG. 15). Thereafter, the photoresist film 117 is removed by asking or the like.

On the cross section taken along a line A-A', the gate electrode 116 has a width larger than the width of the opening portion of the insulating film IL1, and the gate electrode 116 partly extends not only to the upper portion of the gate insulating film 115, but also to the sidewall of the opening portion and the upper portion of the insulating film IL1 (FIG. 15). Moreover, as described above, the gate electrode 116 is disposed in a region other than the formation region of the contact hole on the n+ source layer 102 and the second p+ layer 105 (see FIG. 16). In other words, although the gate electrode 116 extends between the n+ source layers 102 in the X-direction and the Y-direction, it is not formed at their intersection (electric field relaxation region 104) and an opening portion is formed therein. The second p+ layer 105 is disposed below this opening portion (see FIG. 2). Moreover, the gate electrode 116 is connected on the circumference of the opening portion (electric field relaxation region 104). Therefore, the gate electrode 116 forms a continuous film having a plurality of opening portions (opening portions corresponding to the formation regions of the contact holes on the n+ source layer 102 and the second p+ layer 105), and is electrically connected to the gate electrode 116 of each of the cell regions. Note that the formation region of the gate electrode 116 is hatched with dots in FIG. 16. Moreover, as the material for the gate electrode 116, a high melting-point metal such as tungsten (W) or the like may be used in addition to the above-mentioned silicon film.

Figure 17:
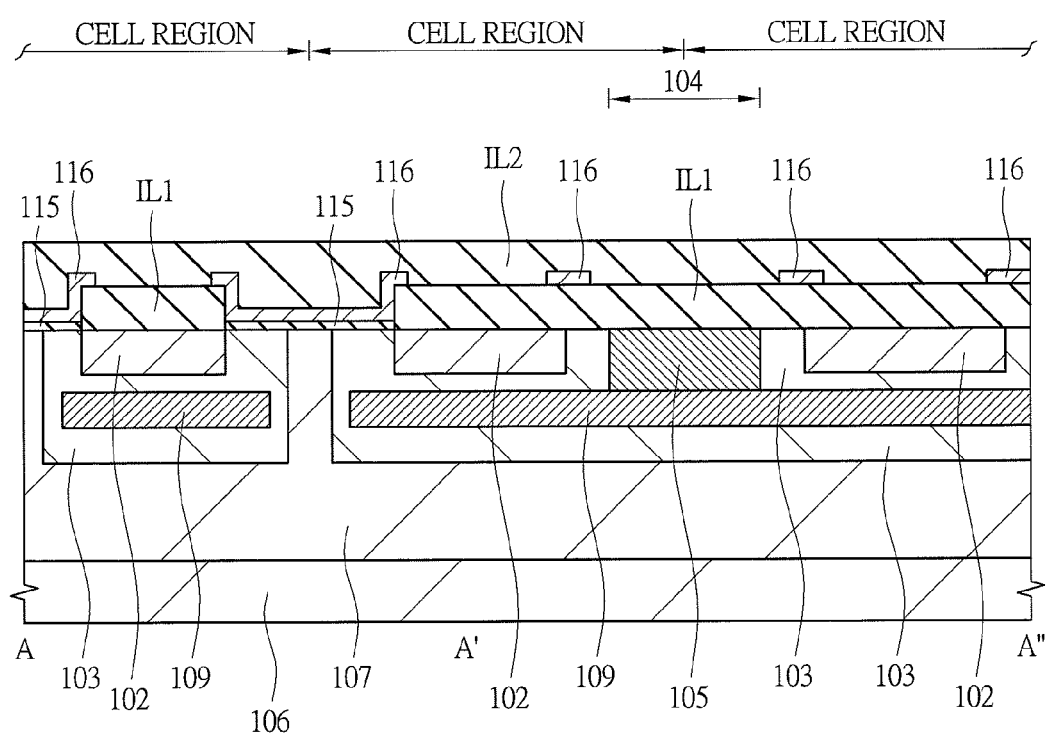
FIG. 17 is a sectional view of a principal part showing the manufacturing process of the semiconductor device of the first embodiment continued from FIG. 15.

Next, as shown in FIG. 17, an interlayer insulating film IL2 is formed on the insulating film IL1 including the upper portion of the gate electrode 116. As the interlayer insulating film IL2, for example, a silicon oxide film is formed by using the CVD method or the like.

Figure 18:
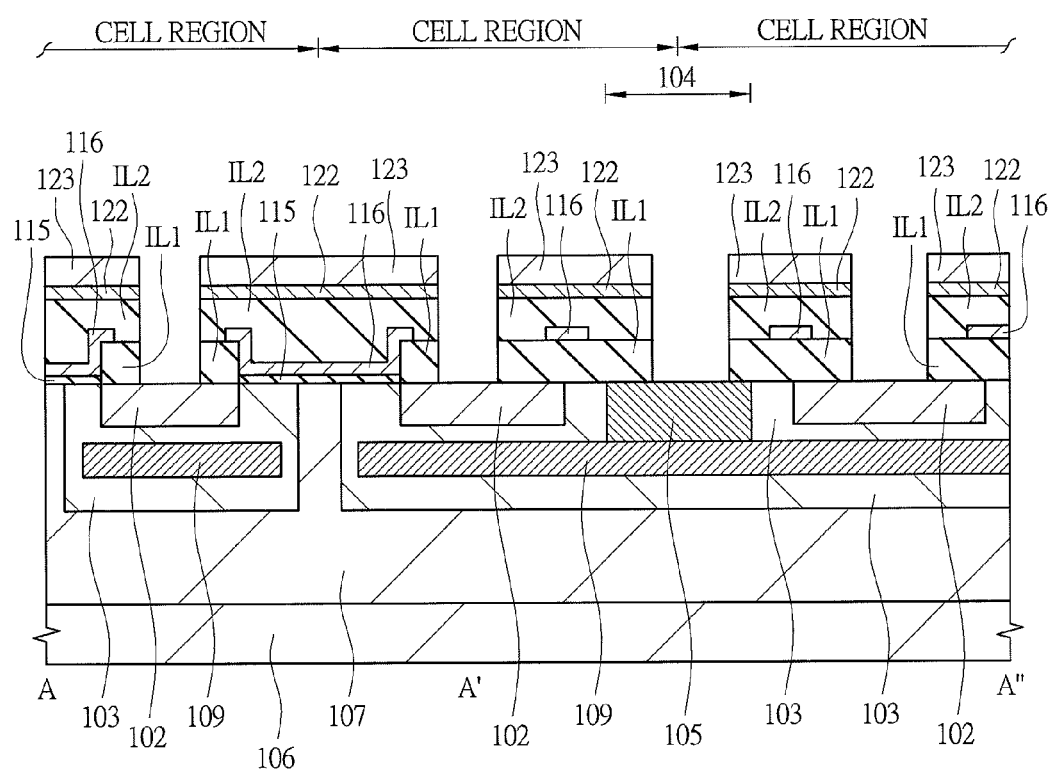
FIG. 18 is a sectional view of a principal part showing the manufacturing process of the semiconductor device of the first embodiment continued from FIG. 17.

Next, as shown in FIG. 18, contact holes are formed on the n+ source layer 102 and the second p+ layer 105. For example, in order to prevent a reaction between the interlayer insulating film IL2 and the metal in a silicide process to be described later, a barrier film made of titanium nitride (TiN) 122 or the like is deposited on the interlayer insulating film IL2 by using a sputtering method. Then, after a photoresist film 123 is applied onto the titanium nitride (TiN) 122 and the pattern is transferred by exposure, a developing process is performed. In this manner, the photoresist film 123 on the n+ source layer 102 and the second p+ layer 105 is removed. By performing a dry etching process on the titanium nitride (TiN) 122 and the interlayer insulating film IL2 with the photoresist film 123 after the development used as a mask, contact holes are formed on the n+ source layer 102 and the second p+ layer 105. Thereafter, the photoresist film 123 is removed by asking or the like.

Figure 19:
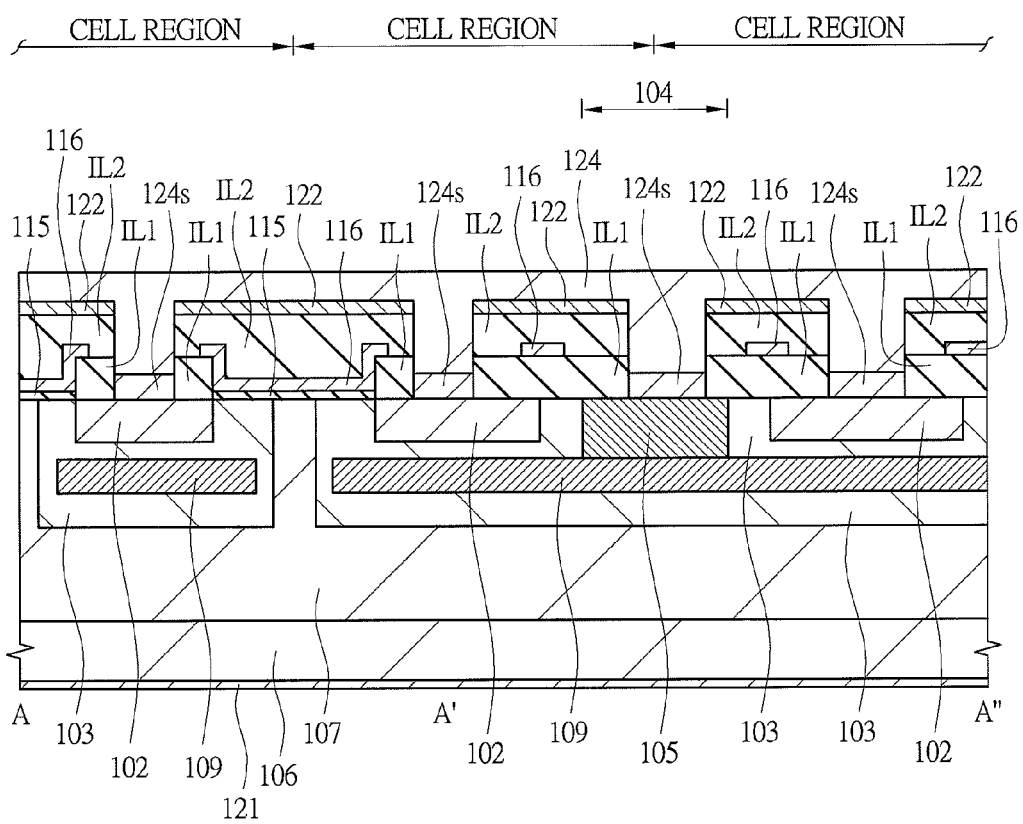
FIG. 19 is a sectional view of a principal part showing the manufacturing process of the semiconductor device of the first embodiment continued from FIG. 18.

Next, as shown in FIG. 19, a metal silicide (metal silicide layer) 124s is formed on the n+ source layer 102 and the second p+ layer 105 exposed from the bottom portions of the contact holes. Moreover, a rear surface electrode (drain electrode) 121 made of metal silicide is formed on the rear surface of the SiC substrate 106. For example, on the titanium nitride (TiN) 122 including the inside of the contact holes, nickel (Ni), titanium (Ti) and nickel (Ni) are sequentially deposited by the sputtering method, thereby forming a metal laminated film. Moreover, on the rear surface of the SiC substrate 106, nickel (Ni) and titanium (Ti) are sequentially deposited by the sputtering method, thereby forming a metal laminated film. Next, a heat treatment (annealing process) is performed for siliciding the interface between the semiconductor region (102, 105, 106) and the metal. For example, the heat treatment is performed in an argon (Ar) atmosphere at a temperature in a range from about 700 to 1000° C. Next, an unreacted metal laminated film is removed by etching. For example, this is removed by a wet etching using sulfuric acid hydrogen peroxide solution or the like. In this manner, the metal silicide 124s is formed on the bottom portion of each contact hole, and the rear surface electrode (drain electrode) 121 made of metal silicide is formed on the rear surface of the SiC substrate 106.

Next, on the metal silicide 124s (n+ source layer 102 and second p+ layer 105) on the front surface side of the SiC substrate 106, a source electrode 124 is formed. For example, by depositing a metal film of Al or the like as a conductive film on the titanium nitride (TiN) 122 including the inside of each contact hole by using the sputtering method or the like, the source electrode 124 is formed. The source electrode 124 connects the n+ source layers 102 to each other and is connected also to the second p+ layer 105.

Thereafter, an insulating film such as a polyimide film may be formed as a protective film (not shown) on the source electrode 124.

Through the above-mentioned processes, the semiconductor device (DMOSFET) of the present embodiment is mostly completed.

<1> As described above, according to the semiconductor device (DMOSFET) of the present embodiment, since the first p+ layer 109 is formed in the middle of the p body layer 103, the diffusion resistance of the p body layer 103 can be lowered, and an operation of a parasitic bipolar transistor formed in a parasitic npn region can be suppressed. As a result, it becomes possible to reduce a surge current, and consequently to prevent characteristic degradation and damage of the DMOSFET due to the surge current.

Figure 28:
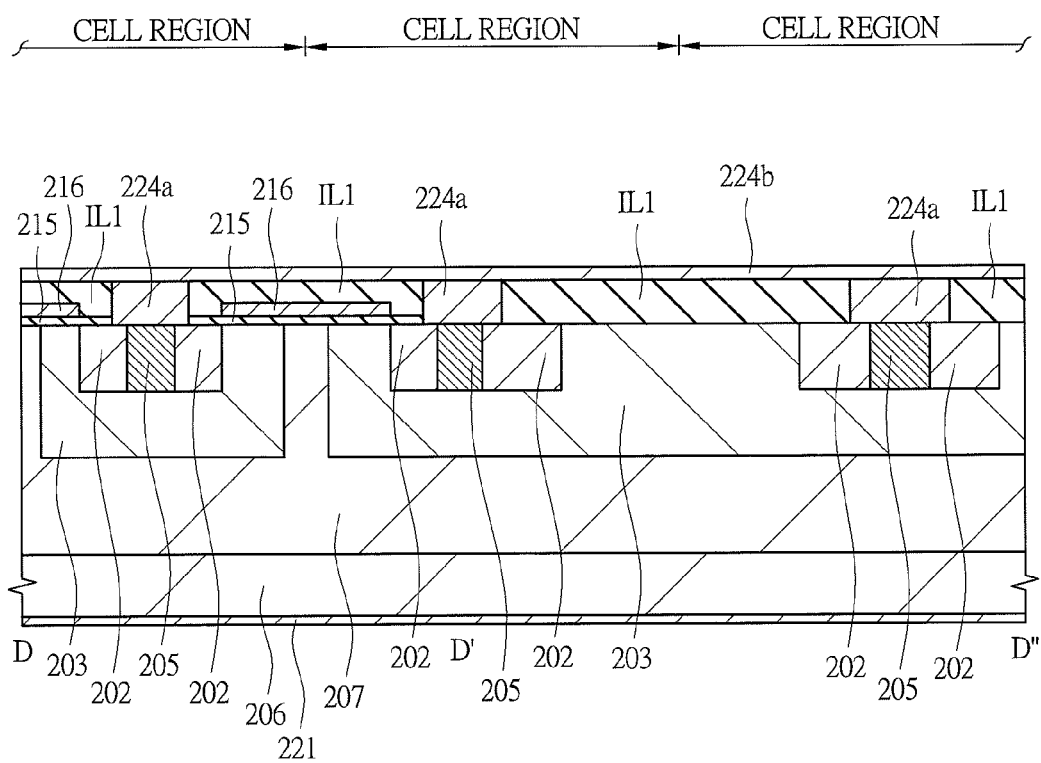
FIG. 28 is a sectional view of a principal part showing a structure of a semiconductor device of a comparative example of the first embodiment.
Figure 29:
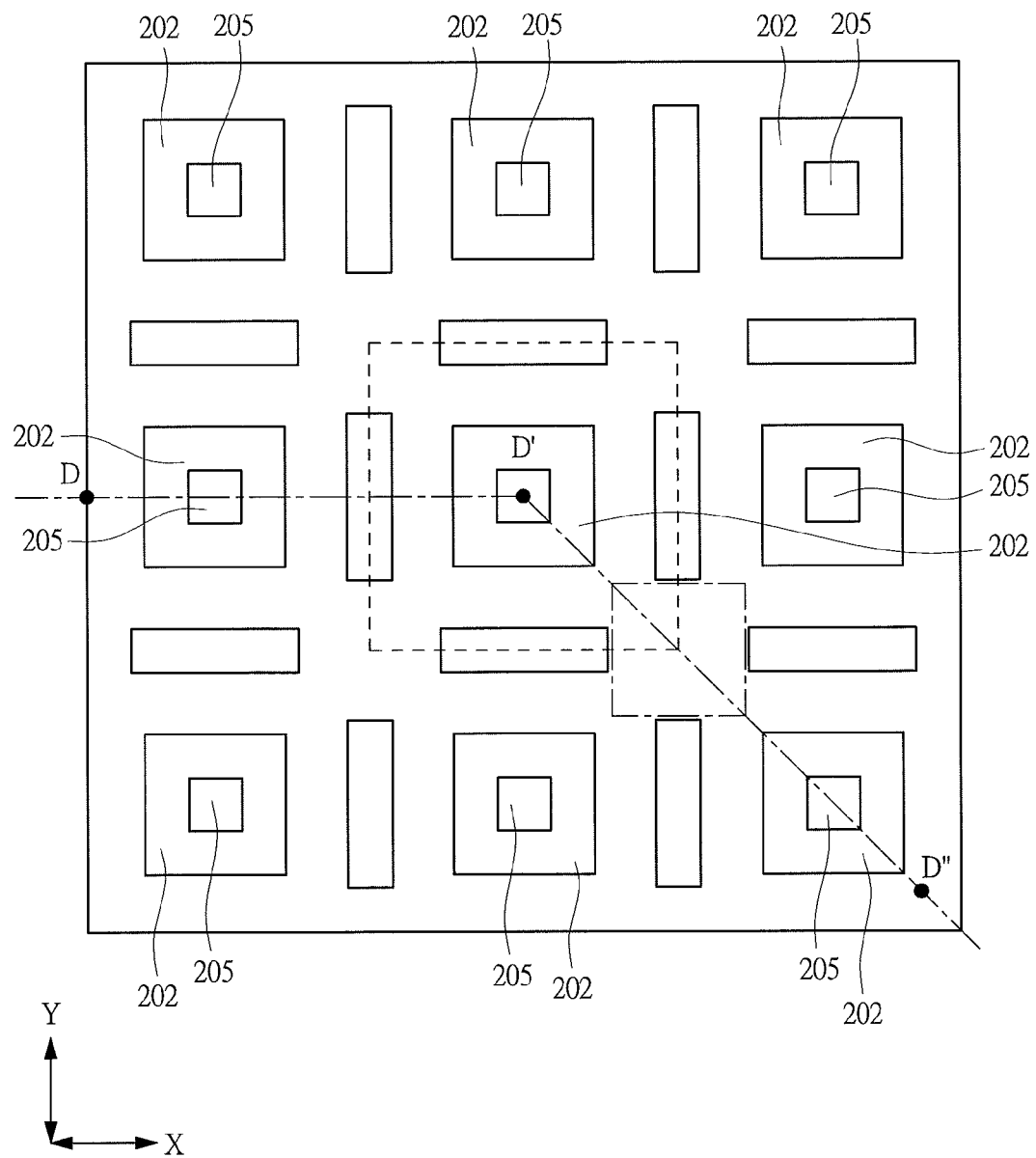
FIG. 29 is a plan view of a principal part showing the structure of the semiconductor device of the comparative example of the first embodiment.

FIG. 28 and FIG. 29 are a sectional view and a plan view of a principal part showing the structure of a semiconductor device (DMOSFET) of a comparative example of the present embodiment. In this case, no first p+ layer (109) is formed in the middle of a p body layer 203, and an electric potential is applied to the p body layer 203 via a p+ layer 205 disposed in the center portion of the n+ source layer 202. A reference numeral 216 denotes a gate electrode. Moreover, reference numerals 224a and 224b denote conductive films, and a source electrode is constituted by a laminated body of these films. Also, a reference numeral 221 denotes a rear surface electrode (drain electrode) disposed on the rear surface of an SiC substrate 206. In this case, in an n− drift layer 207 made of an epitaxial layer on the SiC substrate 206, the p body layer 203, the n+ source layer 202 and the p+ layer 205 are formed.

Figure 30:
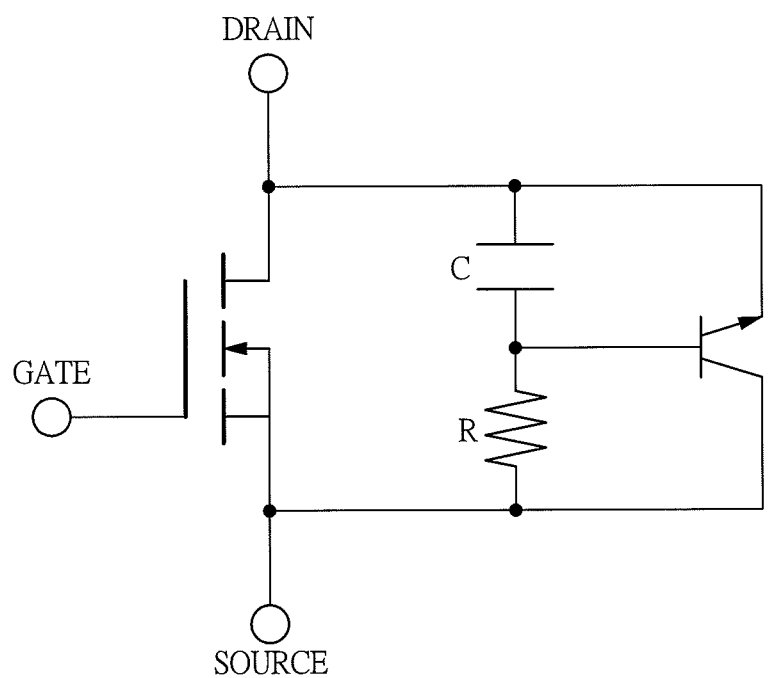
FIG. 30 is a circuit diagram showing an equivalent circuit according to the semiconductor device of the comparative example of the first embodiment.

In this DMOSFET of the comparative example, a parasitic bipolar transistor formed in a parasitic npn region is present. In other words, the parasitic bipolar transistor, which is composed of a resistance of the p body layer (203) right below the n+ source layer (202), a parasitic capacitance between the n− drift layer (207) and the p body layer (203), a parasitic capacitance between the gate electrode (216) and the n− drift layer (207) and a parasitic capacitance between the gate electrode (216) and the p body layer (203), is present. Here, supposing that the combined capacitance of the above-mentioned three parasitic capacitances is C, an equivalent circuit is like that shown in FIG. 30. FIG. 30 is a circuit diagram showing the equivalent circuit according to the semiconductor device of the comparative example of the present embodiment. The parasitic bipolar transistor can operate in the following manner.

For example, when a voltage (surge voltage) caused by a surge or the like is applied between the rear surface electrode 221 and the source electrode (224a, 224b), a surge current I derived from this flows into the source electrode (224a, 224b) from the p body layer 203 through the n+ source layer 202 via the parasitic capacitance C. At this time, between the p body layer 203 and the n− drift layer 207 adjacent thereto, a potential difference V equivalent to the product of the surge current and the resistance (V=R×I) is generated by an internal resistance R of the p body layer 203. In the case when a potential difference between the n+ source layer 202 and the p body layer 203 becomes greater than a forward voltage of the pn-junction of these by this potential difference V, the surge current I that has flown into the p body layer 203 between the p body layer 203 and the n⁻ drift layer 207 adjacent thereto directly flows into the n⁺ source layer 202. This surge current I functions as the base current of the parasitic bipolar transistor, so that the parasitic bipolar transistor is turned on (operates).

Moreover, when the current (base current) flows into the parasitic bipolar transistor, the temperature of the parasitic bipolar transistor is raised by Joule heat. Since the resistances of the respective members constituting the parasitic bipolar transistor are lowered in conjunction with this temperature rise, a still greater current flows. As described above, a vicious cycle occurs in which, when the amount of the current increases, the Joule heat is increased, and the amount of the current is further increased due to resistance reduction.

In particular, since the DMOSFET is constituted by a plurality of cells that are disposed in an array, a surge current is concentrated on a cell having a parasitic bipolar transistor whose resistance is lowest among the parasitic bipolar transistors of the respective cells. As a result, the entire DMOSFET might be damaged.

In contrast, according to the present embodiment, as described above, since the first p⁺ layer 109 is formed in the middle of the p body layer 103, the diffusion resistance of the p body layer 103 can be reduced. For this reason, even when the surge voltage is applied, the potential difference V between the p body layer 203 and the n⁻ drift layer 207 adjacent thereto can be made smaller. As a result, it becomes possible to make the parasitic bipolar transistor harder to turn on. Therefore, it becomes possible to reduce a surge current, and consequently to prevent characteristic degradation and damage of the DMOSFET due to the surge current.

<2> Moreover, according to the present embodiment, since the second p⁺ layer 105 for leading out the first p⁺ layer 109 in the middle of the p body layer 103 is disposed by utilizing the electric field relaxation region 104, the n⁺ source layer 202 can be made smaller. More specifically, the n⁺ source layer 202 can be made smaller by the size corresponding to the p⁺ layer 205 shown in FIG. 29, and the cell area can be reduced. As described above, by the reduction of the cell area, the possibility that defects which are present in the substrate at random are contained in the elements can be lowered, so that the device characteristics and the yield can be improved.

Moreover, the number of cells per unit area can be increased and the ratio of the channel region can be increased. Thus, for example, the on-resistance can be reduced. Furthermore, the amount of current per unit area can be improved. In this manner, the characteristics of the DMOSFET can be improved.

Moreover, by omitting the p⁺ layer 205 (FIG. 28) in the n⁺ source layer 202, the connection area between the n⁺ source layer 102 and the source electrode (124, 124s, see FIG. 2) can be made larger, so that the source resistance can be reduced.

<3> The DMOSFET of the present embodiment provided with a channel in a direction in parallel with the substrate front surface is referred to as "planar type". On the other hand, there is another structure referred to as "trench gate type" in which a trench is formed on the surface and a gate electrode is buried therein. Therefore, the trench gate structure may be adopted in the present embodiment.

In the case of this "trench gate type", since JFET resistance (Junction Field Effect Transistor Resistance) is low in comparison with that of the "planar type", it is possible to reduce the on-resistance. However, in the case of using a substrate (106) and a semiconductor region (107) made of, for example, 4H—SiC having an off angle of 4 degrees in a (112-0) direction, a hexagonal system different from that of Si is formed. Due to this crystal structure, it becomes difficult to form the trench so as to have a (112-0) plane with which the channel resistance becomes smallest.

Therefore, by adopting the above-mentioned "planar type" structure, the trench forming process becomes unnecessary, so that a semiconductor device (DMOSFET) having superior characteristics can be formed by a simple process. Moreover, according to the present embodiment, as described above, since the second p⁺ layer 105 which serves as a lead-out portion for leading out the first p⁺ layer 109 is disposed by utilizing the electric field relaxation region 104, the n⁺ source layer 102 can be made smaller, the number of cells per unit area can be increased, and the ratio of the channel region can be increased. Consequently, the on-resistance can be reduced, and the on-resistance that is almost equivalent to that of "trench gate type" can be realized.

Second Embodiment

In the first embodiment, nine cell regions (FIG. 1) have been described, but these regions are located inside a cell array region. In the present embodiment, one example of a layout of each of patterns (102, 105, 103, and the like) at the end portion of the cell array region will be described.

Application Example 1

Figure 20:
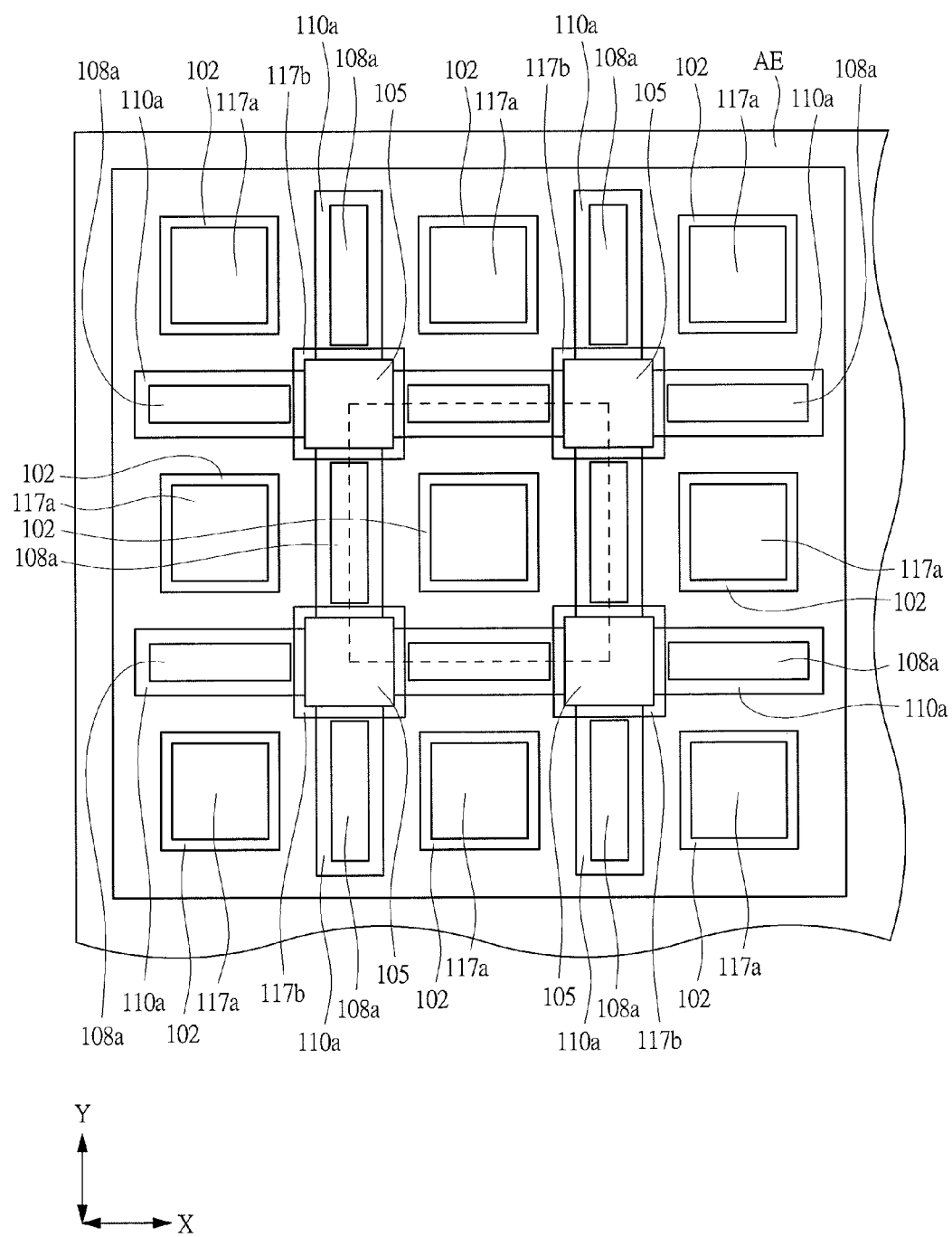
FIG. 20 is a plan view of a principal part of a semiconductor device of an application example 1 of the second embodiment.

FIG. 20 is a plan view of a principal part of a semiconductor device of an application example 1 of the present embodiment. In the drawing, AE denotes a cell array region, and FIG. 20 shows a layout of each of patterns at the end portion of the cell array region.

In FIG. 20, respective patterns are disposed in the same manner as the respective patterns shown in FIG. 1. Note that corresponding members are denoted by the same reference numerals, and repetitive descriptions thereof are omitted. In this manner, also in the end portions of the cell array region, the same layout as the pattern layout of the inside of the cell array region may be used.

Application Example 2

Figure 21:
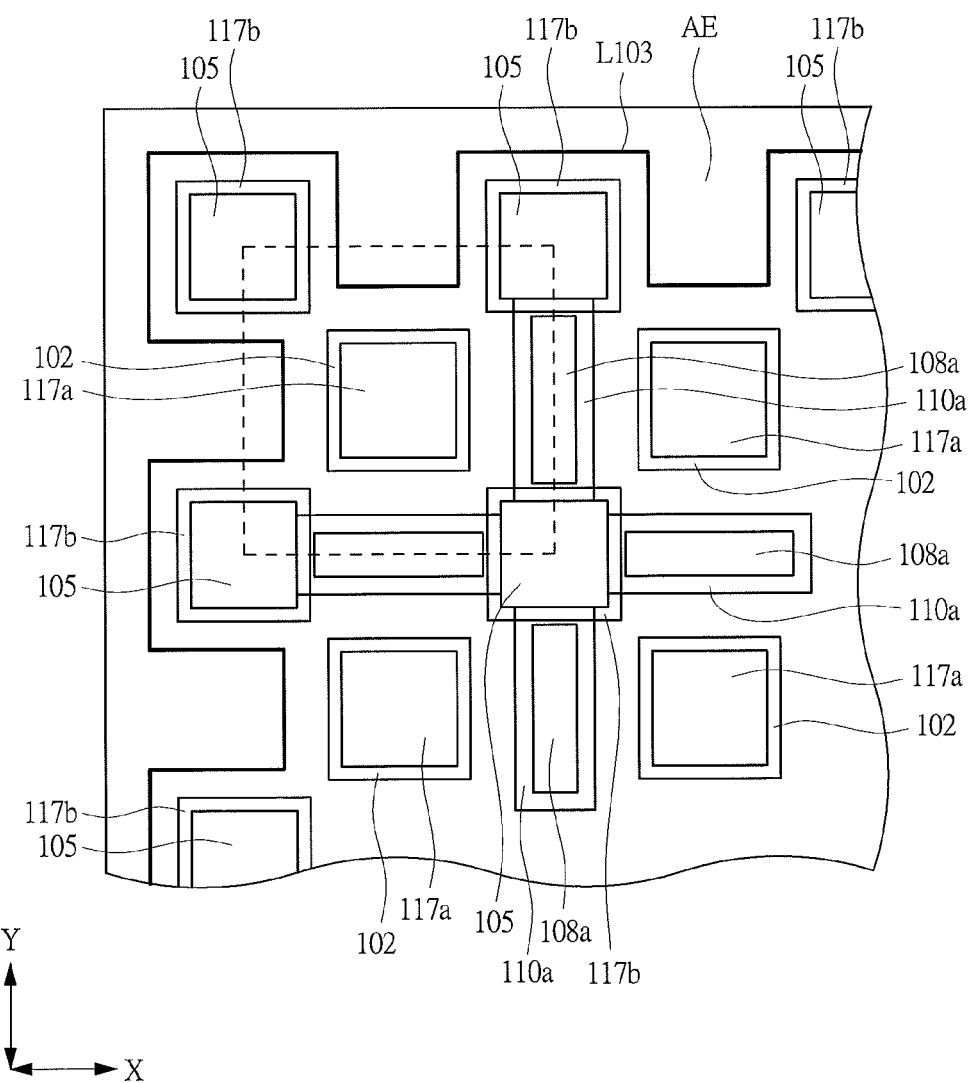
FIG. 21 is a plan view of a principal part of a semiconductor device of an application example 2 of the second embodiment.

FIG. 21 is a plan view of a principal part of a semiconductor device of an application example 2 of the present embodiment. In the drawing, AE denotes a cell array region, and FIG. 21 shows a layout of each of patterns at the end portion of the cell array region.

In FIG. 21, of the respective patterns shown in FIG. 1, the second p⁺ layer (lead-out portion, contact portion) 105 is disposed on the end portion of the cell array region. By disposing the second p⁺ layer (lead-out portion, contact portion) 105 at the end portion of the cell array region in this manner, the occupied area of the second p⁺ layer 105 in the cell array region (p body layer 103) is increased, so that the characteristics of the DMOSFET can be further improved. Note that the end portion of the p body layer 103 is indicated by L103 (thick line).

Application Example 3

Figure 22:
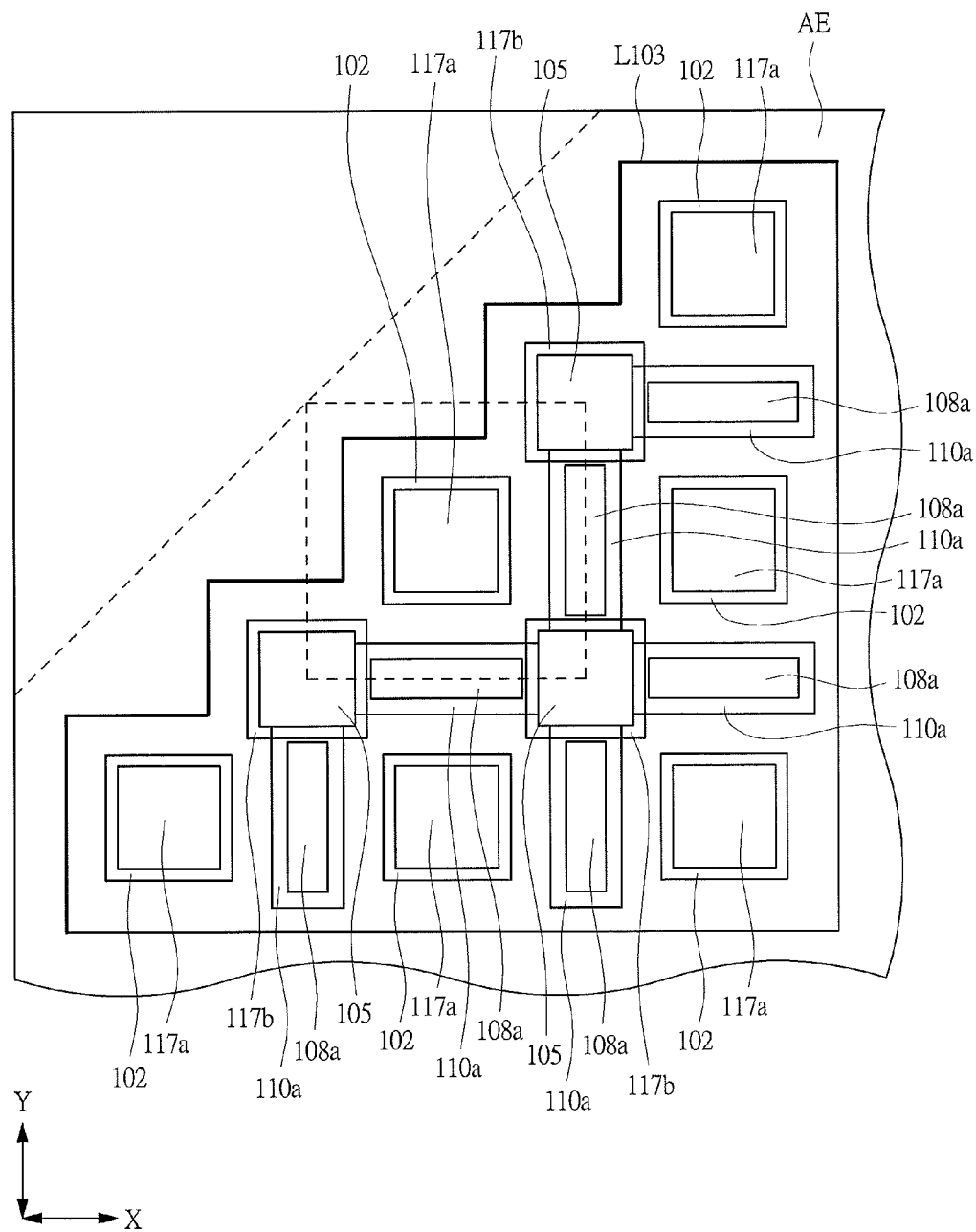
FIG. 22 is a plan view of a principal part of a semiconductor device of an application example 3 of the second embodiment.

FIG. 22 is a plan view of a principal part of a semiconductor device of an application example 3 of the present embodiment. In the drawing, AE denotes a cell array region, and FIG. 22 shows a layout of each of patterns at the end portion of the cell array region.

In FIG. 22, of the respective patterns shown in FIG. 1, the n+ source layer (source region) 102 and the second p+ layer 105 are disposed on the end portion of the cell array region. By disposing the n+ source layer 102 and the second p+ layer 105 to be connected to the source electrode 124 on the end portion of the cell array region in this manner, the occupied area of the second p+ layer 105 in the cell array region (p body layer 103) is increased, so that the characteristics of the DMOSFET can be further improved. Moreover, the occupied area of the n+ source layer 102 in the cell array region (p body layer 103) is increased, so that the characteristics of the DMOSFET can be further improved. Note that the end portion of the p body layer 103 is indicated by L103 (thick line).

Third Embodiment

In the first embodiment, the second p+ layer (lead-out portion, contact portion) 105 is formed in the electric field relaxation region 104, and is electrically connected to the first p+ layer 109. However, the second p+ layer (lead-out portion, contact portion) 105 may be provided in the n+ source layer 102.

Figure 23:
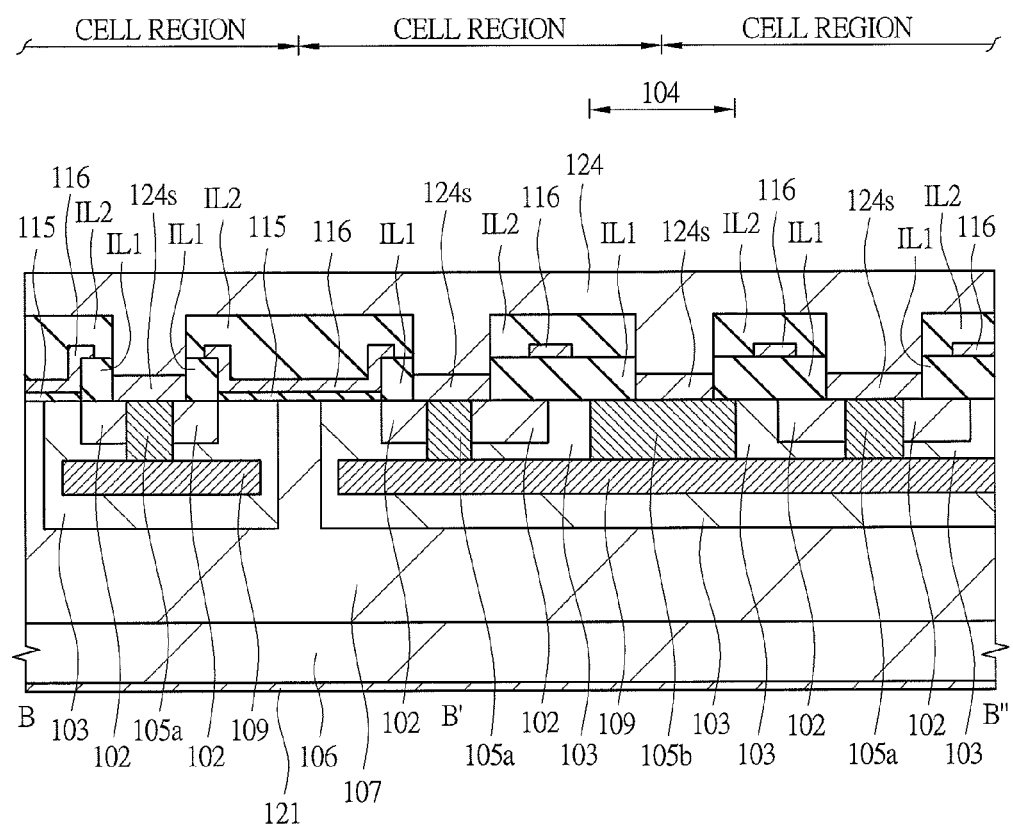
FIG. 23 is a sectional view of a principal part of a semiconductor device of the third embodiment.
Figure 24:
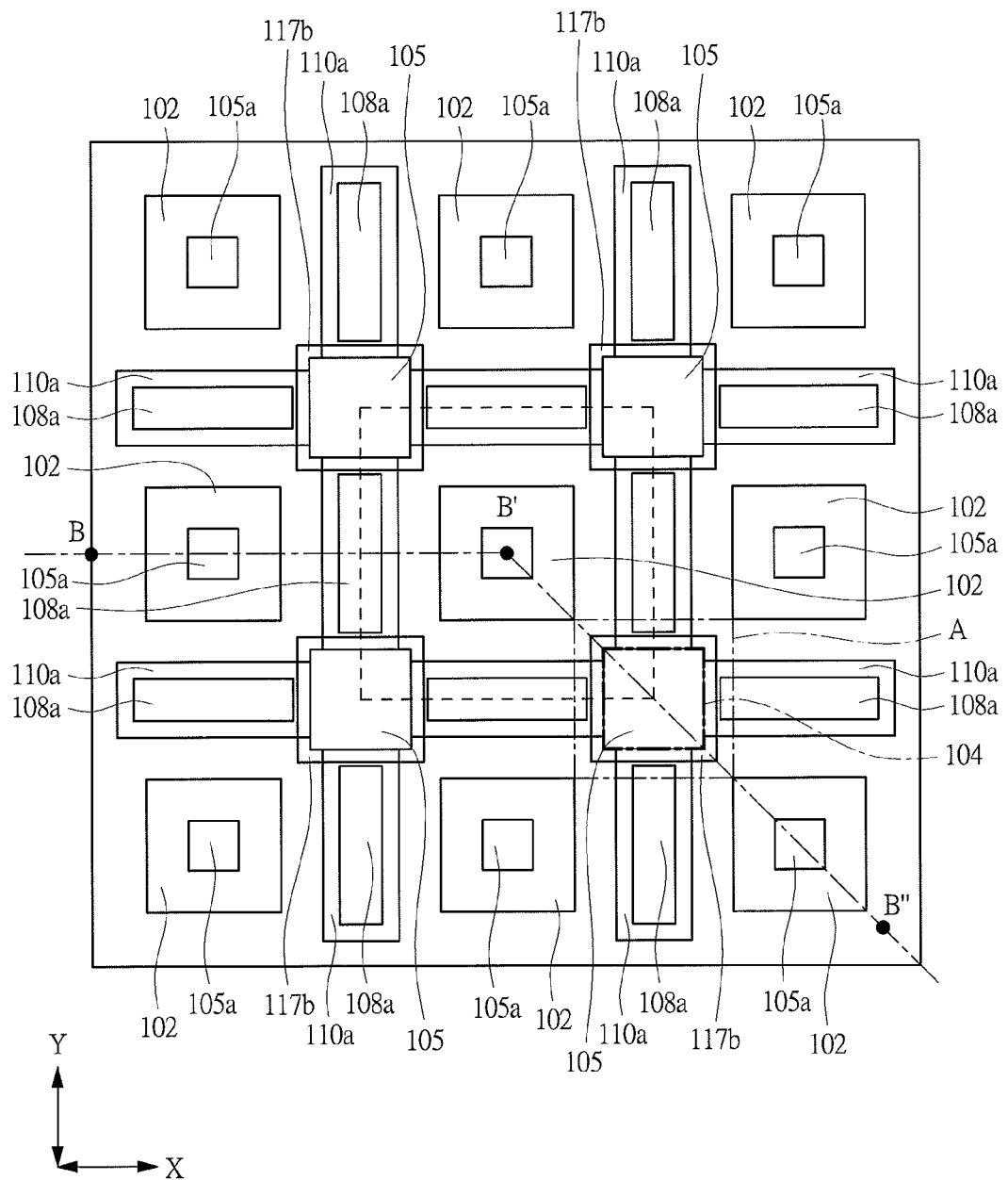
FIG. 24 is a plan view of a principal part of the semiconductor device of the third embodiment.

The structure of a semiconductor device (DMOSFET) of the present embodiment will be described with reference to FIG. 23 and FIG. 24. FIG. 23 is a sectional view of a principal part of the semiconductor device of the present embodiment, and FIG. 24 is a plan view of a principal part of the semiconductor device of the present embodiment. FIG. 23 corresponds to, for example, a cross section taken along a line B-B" of FIG. 24.

Since the present embodiment is different from the first embodiment only in a second p+ layer 105a (lead-out portion, contact portion) in the n+ source layer 102, the corresponding structure and the structure adjacent thereto will be described in detail, and the description of the other structures will be omitted.

Also in the present embodiment, in the same manner as the first embodiment, the first p+ layer 109 (buried layer, buried semiconductor region) is disposed inside (in the middle of) the p body layer 103 (see FIG. 23 and FIG. 2).

Moreover, the formation region of the first p+ layer 109 is disposed in a region other than the opening portion 110a (see FIG. 24). The opening portion 110a is a region slightly larger than the above-mentioned exposed portion 108a. Therefore, the first p+ layer 109 is also electrically connected between the cell regions via the region A of FIG. 24 (FIG. 7).

Moreover, as shown in FIG. 23, the first p+ layer 109 is electrically connected to the second p+ layer 105b (lead-out portion, contact portion) in the electric field relaxation region 104. Moreover, the first p+ layer 109 is electrically connected to the second p+ layer 105a (lead-out portion, contact portion) disposed inside the above-mentioned n+ source layer 102. As shown in FIG. 24, the second p+ layer 105a (lead-out portion, contact portion) is surrounded by the n+ source layer 102. Moreover, as is apparent from FIG. 23, the bottom portion of the second p+ layer 105a (lead-out portion, contact portion) is located at a position deeper than the bottom portion of the n+ source layer 102.

The impurity concentrations of the first and second p+ layers (109, 105a, 105b) are higher than the impurity concentration of the p body layer 103.

As described above, also in the semiconductor device (DMOSFET) of the present embodiment, since the first p+ layer 109 is formed in the middle of the p body layer 103, it becomes possible to reduce the diffusion resistance of the p body layer 103 and also to suppress the operation of a parasitic bipolar transistor formed in the parasitic npn region. As a result, it becomes possible to reduce the surge current, and consequently to prevent characteristic degradation and damages of the DMOSFET due to the surge current.

With respect to the manufacturing method of the semiconductor device of the present embodiment, at the time of the forming process of the second p+ layer 105 of the first embodiment, the second p+ layer (105a, 105b) may be simultaneously formed (see FIG. 8). Since the other processes are the same as those of the first embodiment, the description thereof will be omitted.

Moreover, in the present embodiment, the second p+ layers (105a, 105b) are used for the connection to the first p+ layer 109. Alternatively, only the second p+ layer 105a (lead-out portion, contact portion) in the n+ source layer 102 may be used for the connection to the first p+ layer 109 by omitting the second p+ layer 105b.

Also in the above-mentioned structure, the diffusion resistance of the p body layer 103 can be reduced by the first p+ layer 109 in the middle of the p body layer 103, so that the operation of the parasitic bipolar transistor formed in the parasitic npn region can be suppressed. As a result, it becomes possible to reduce the surge current, and consequently to prevent characteristic degradation and damages of the DMOSFET due to the surge current.

As described above, the second p+ layer (lead-out portion, contact portion) may be disposed in the n+ source layer (source region) 102 in addition to the inside of the electric field relaxation region 104.

Fourth Embodiment

In the first embodiment, the n+ source layer (source region) 102 and the cell region are formed into a square shape (regular tetragon) (see FIG. 1), but these regions are not limited to this shape, and may be formed into another shape.

Application Example A

Figure 25:
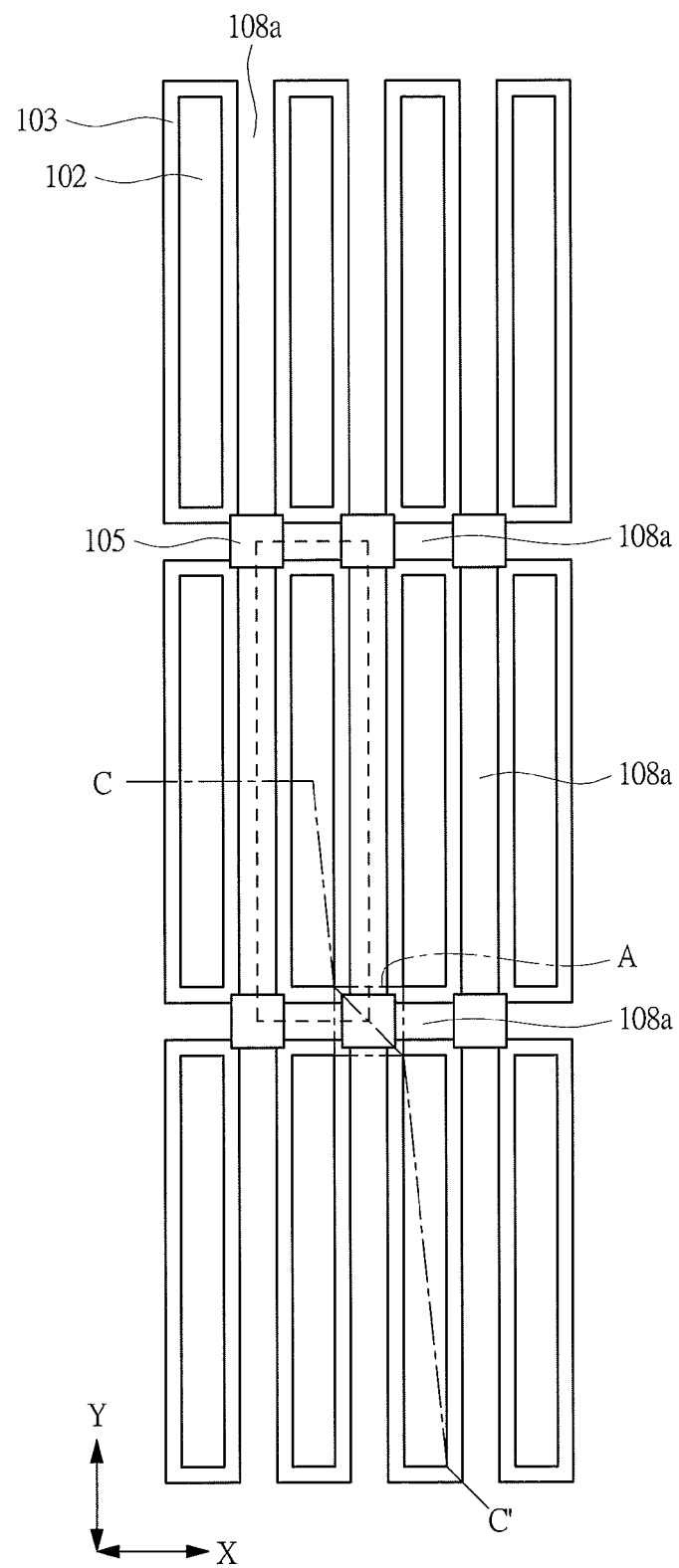
FIG. 25 is a plan view of a principal part of a semiconductor device of an application example A of the fourth embodiment.

FIG. 25 is a plan view of a principal part of a semiconductor device of an application example A of the present embodiment. In this application example A, the planar shape of the n+ source layer (source region) 102 is a rectangular shape (quadrilateral shape). In this case, the side extending in the Y-direction corresponds to a longer side and the side extending in the X-direction corresponds to a shorter side. On the outer circumference of the n+ source layer (source region) 102, the p body layer (p-type body region) 103 is disposed.

Also in this case, the electric field relaxation region is provided in a region A formed by connecting adjacent vertices (corner portions) of the four n+ source layers (source regions) 102, the second p+ layer (lead-out portion, contact portion) 105 is disposed in the electric field relaxation region, and the first p+ layer 109 is disposed so as to extend from the lower portion of the second p+ layer 105 to the lower portion of the above-mentioned n+ source layer (source region) 102.

For example, the structure of the cross section taken along a line C-C' of FIG. 25 has the same arrangement as that of the first embodiment described with reference to FIG. 2 except for the dimensions of the respective patterns.

Application Example B

Figure 26:
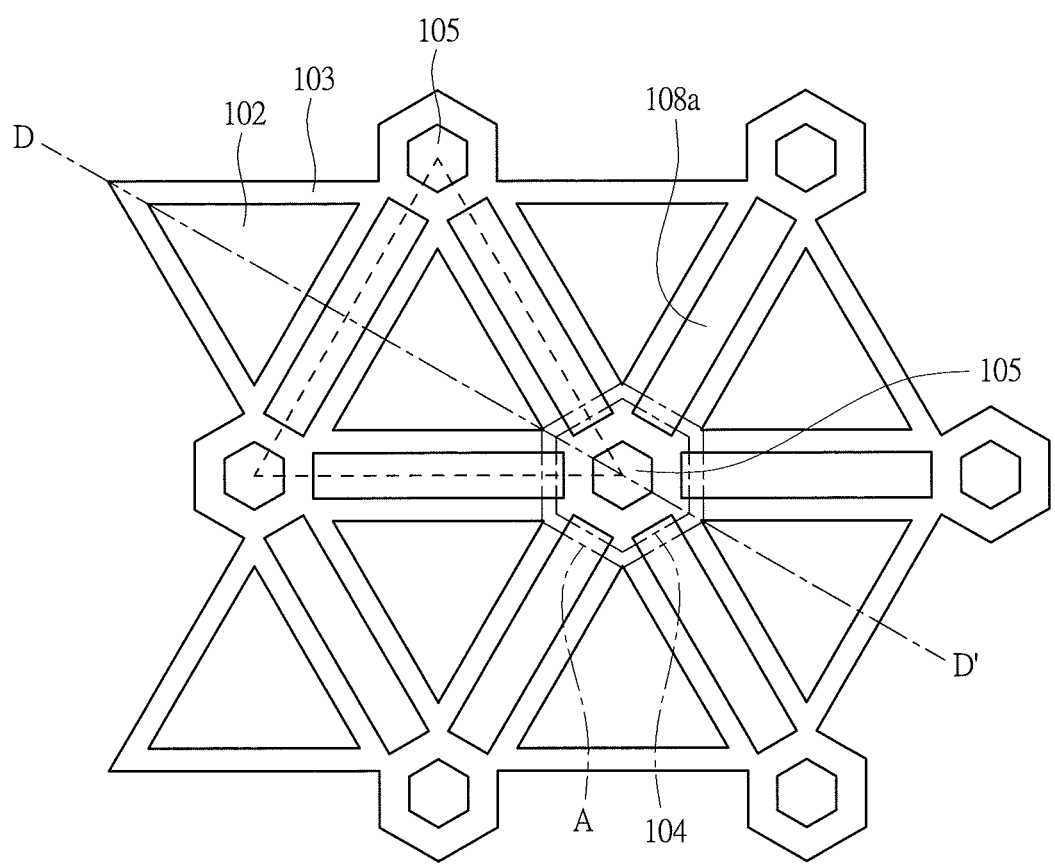
FIG. 26 is a plan view of a principal part of a semiconductor device of an application example B of the fourth embodiment.

FIG. 26 is a plan view of a principal part of a semiconductor device of an application example B of the present embodiment. In this application example B, the planar shape of the n+ source layer (source region) 102 is a regular triangular shape.

On the outer circumference of the n$^+$ source layer (source region) 102, the p body layer (p-type body region) 103 is disposed.

In this case, the electric field relaxation region 104 is provided in a region A formed by connecting adjacent vertices (corner portions) of the six n$^+$ source layers (source regions) 102, the second p$^+$ layer (lead-out portion, contact portion) 105 is disposed in the electric field relaxation region 104, and the first p$^+$ layer 109 is disposed so as to extend from the lower portion of the second p$^+$ layer 105 to the lower portion of the above-mentioned n$^+$ source layer (source region) 102. In other words, the plurality of n$^+$ source layers 102 (six n$^+$ source layers 102 in FIG. 26) are disposed around the electric field relaxation region 104 so as to be spaced apart from one another, and the first p$^+$ layer 109 that extends to the lower portions of the n$^+$ source layers 102 is connected to the second p$^+$ layer (lead-out portion, contact portion) 105 in the electric field relaxation region 104.

For example, the structure of the cross section taken along a line D-D' of FIG. 26 has the same arrangement as that of the first embodiment described with reference to FIG. 2 except for the dimensions of the respective patterns.

In this manner, the planar shapes of the n$^+$ source layer (source region) 102 and the cell region can be designed to be a quadrilateral shape or a triangular shape. Moreover, another shape other than these such as a regular hexagonal shape may be adopted. Also, these are not necessarily designed to be a regular polygonal shape.

As described above in detail, even when the shapes of the n$^+$ source layer (source region) 102 and the cell region are changed, the same effects as those of the first embodiment can be obtained.

Fifth Embodiment

Figure 27:
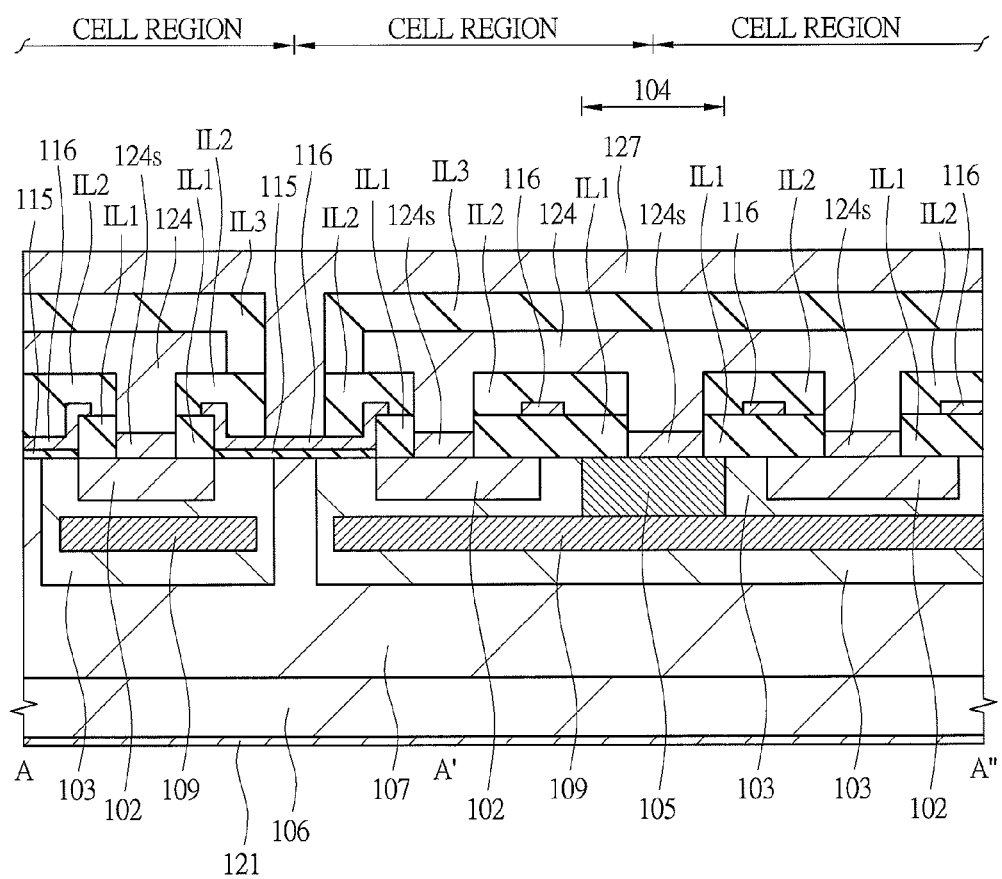
FIG. 27 is a sectional view of a principal part of a semiconductor device of the fifth embodiment.

In the first embodiment, the source electrode (source wire, wiring) 124 is disposed on the interlayer insulating film IL2, but an interlayer insulating film may be further formed on this source electrode 124 so as to form a gate wire 127. FIG. 27 is a sectional view of a principal part of a semiconductor device of the present embodiment.

Since the structures below the interlayer insulating film IL2 and the manufacturing process thereof are the same as those of the first embodiment, the descriptions thereof will be omitted.

As shown in FIG. 27, in the same manner as the first embodiment, contact holes are formed in the interlayer insulating films IL1 and IL2, and a metal silicide 124s is formed on the n$^+$ source layer 102 and the second p$^+$ layer 105 exposed from the bottom portions of the contact holes (see FIG. 19). Moreover, a rear surface electrode (drain electrode) 121 made of metal silicide is formed on the rear surface of the SiC substrate 106 (see FIG. 19).

Next, on the metal silicide 124s (n$^+$ source layer 102 and second p$^+$ layer 105) on the front surface side of the SiC substrate 106, the source electrode 124 is formed. For example, by depositing a metal film made of Al or the like as a conductive film on the interlayer insulating film IL2 including the inside of each contact hole by using the sputtering method or the like, the source electrode 124 is formed (in FIG. 27, the illustration of the titanium nitride 122 is omitted). Next, by removing the source electrode 124 on the gate electrode 116 by a patterning process, opening portions are formed (FIG. 27). Next, an interlayer insulating film IL3 is formed on the source electrode 124 including the inside of the opening portion. This interlayer insulating film IL3 can be formed in the same manner as the interlayer insulating films IL1 and IL2. Next, the interlayer insulating films IL2 and IL3 on the gate electrode 116 are removed by etching or the like, thereby forming contact holes. Next, by depositing a metal film made of Al or the like as a conductive film on the interlayer insulating film IL3 including the inside of each contact hole by using a sputtering method or the like, the gate wire 127 is formed. Thereafter, an insulating film such as a polyimide film may be formed on the gate wire 127 as a protective film (not shown).

As described above, the gate wire 127 to be electrically connected to the gate electrode 116 may be formed. Although the gate wire 127 is disposed as the upper layer and the source electrode 124 is disposed as the lower layer in the present embodiment, these may be reversely disposed so that the gate wire 127 is disposed as the lower layer and the source electrode 124 is disposed as the upper layer.

In the foregoing, the invention made by the inventors of the present invention has been concretely described based on the embodiments. However, it is needless to say that the present invention is not limited to the foregoing embodiments and various modifications and alterations can be made within the scope of the present invention.

INDUSTRIAL APPLICABILITY

The present invention relates to a semiconductor device and a manufacturing method of the semiconductor device, and is effectively applied to a semiconductor device having a double-diffused MOSFET (DMOSFET).

DESCRIPTION OF REFERENCE SIGNS 102 n$^+$ source layer
103 p body layer
104 electric field relaxation region
105 second p$^+$ layer
105a second p$^+$ layer
105b second p$^+$ layer
106 SiC substrate
107 n$^-$ drift layer
108 photoresist film
108a exposed region
109 first p$^+$ layer
110 photoresist film
110a opening portion
112 photoresist film
113 photoresist film
114 photoresist film
115 gate insulating film
116 gate electrode
117 photoresist film
121 drain electrode
122 titanium nitride
123 photoresist film
124 source electrode
124a metal silicide
127 gate wire
202 n$^+$ source layer
203 p body layer
205 p$^+$ layer
206 SiC substrate
207 n$^-$ drift layer
216 gate electrode
221 rear surface electrode
224a conductive film
224b conductive film
AE cell array region C parasitic capacitance
I surge current
IL1 insulating film
IL2 interlayer insulating film
IL3 interlayer insulating film
R resistance

The invention claimed is:

1. A semiconductor device comprising:
a first semiconductor region of a second conductivity type which is disposed on an upper portion of a first surface side of a substrate;
a plurality of source regions of a first conductivity type which are disposed on the upper portion of the first surface side of the substrate and arranged on a circumference of the first semiconductor region so as to be spaced apart from one another;
second semiconductor regions of the second conductivity type which respectively surround the plurality of source regions;
a gate electrode which is disposed on an upper portion of the second semiconductor region via a gate insulating film; and
a buried semiconductor region of the second conductivity type which is disposed in the first semiconductor region, extends from a lower portion of the first semiconductor region to a portion below the plurality of source regions, and has a concentration of an impurity of the second conductivity type higher than that in the second semiconductor region.

2. The semiconductor device according to claim 1, wherein the first semiconductor region has a concentration of an impurity of the second conductivity type higher than that in the second semiconductor region.

3. The semiconductor device according to claim 1, wherein the plurality of source regions and the first semiconductor region are connected to a first wire.

4. The semiconductor device according to claim 1, further comprising:
a third semiconductor region of the first conductivity type which is in contact with the second semiconductor region,
wherein the third semiconductor region is connected to a drain electrode disposed on a second surface side of the substrate.

5. The semiconductor device according to claim 1, wherein a planar shape of each of the plurality of source regions is a quadrilateral shape.

6. The semiconductor device according to claim 1, wherein a planar shape of each of the plurality of source regions is a triangular shape.

7. The semiconductor device according to claim 1, wherein a planar shape of each of the plurality of source regions is a polygonal shape.

8. A semiconductor device comprising:
a first source region of a first conductivity type which is disposed on an upper portion of a first surface side of a substrate;
a first semiconductor region of a second conductivity type which surrounds the first source region and has a channel region;
a second semiconductor region of the first conductivity type which is in contact with the first semiconductor region;
a gate electrode which is disposed on an upper portion of the channel region via a gate insulating film; and
a buried semiconductor region of the second conductivity type which is disposed in the first semiconductor region, extends to a portion below the source region, and has a concentration of an impurity of the second conductivity type higher than that in the first semiconductor region.

9. The semiconductor device according to claim 8, wherein a bottom portion of the first source region is shallower than an upper portion of the buried semiconductor region, and the first semiconductor region is interposed between the bottom portion of the first source region and the upper portion of the buried semiconductor region.

10. The semiconductor device according to claim 8, further comprising:
a fourth semiconductor region disposed in the first source region,
wherein the buried semiconductor region is disposed so as to be in contact with a lower portion of the fourth semiconductor region.

11. The semiconductor device according to claim 8, wherein the second semiconductor region is connected to a drain electrode which is disposed on a second surface side of the substrate.

12. The semiconductor device according to claim 8, further comprising:
a second source region of the first conductivity type which is disposed at a diagonal position with respect to the first source region; and
a third semiconductor region of the second conductivity type which is disposed between the first source region and the second source region,
wherein the buried semiconductor region is disposed so as to be in contact with a lower portion of the third semiconductor region.

13. The semiconductor device according to claim 12, wherein the third semiconductor region has a concentration of an impurity of the second conductivity type higher than that in the first semiconductor region.

14. The semiconductor device according to claim 12, wherein the first source region and the third semiconductor region are connected to a first wire.

* * * * *